(12) United States Patent
Takatsuka

(10) Patent No.: US 12,235,392 B2
(45) Date of Patent: Feb. 25, 2025

(54) SENSOR AND DISTANCE MEASUREMENT APPARATUS HAVING AN AVALANCHE PHOTODIODE AND ON-CHIP LENS

(71) Applicant: SONY SEMICONDUCTOR SOLUTIONS CORPORATION, Kanagawa (JP)

(72) Inventor: Yusuke Takatsuka, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 551 days.

(21) Appl. No.: 17/310,841

(22) PCT Filed: Jan. 30, 2020

(86) PCT No.: PCT/JP2020/003325
§ 371 (c)(1),
(2) Date: Aug. 26, 2021

(87) PCT Pub. No.: WO2020/179290
PCT Pub. Date: Sep. 10, 2020

(65) Prior Publication Data
US 2022/0120868 A1    Apr. 21, 2022

(30) Foreign Application Priority Data

Mar. 6, 2019    (JP) ................. 2019-040812

(51) Int. Cl.
G01S 7/481    (2006.01)
G01S 17/894    (2020.01)
H01L 27/146    (2006.01)

(52) U.S. Cl.
CPC ........ *G01S 7/4816* (2013.01); *H01L 27/1462* (2013.01); *H01L 27/14627* (2013.01);
(Continued)

(58) Field of Classification Search
CPC ......... H01L 27/14627; H01L 27/14629; H01L 31/107; G01J 2001/4466; G01S 7/4816
See application file for complete search history.

(56) References Cited

U.S. PATENT DOCUMENTS

| 10,651,222 B2 * | 5/2020 | Kato ................ H01L 27/1463 |
| 2006/0174824 A1 * | 8/2006 | Hiramoto .......... H10K 30/451 |
| | | 117/89 |

(Continued)

FOREIGN PATENT DOCUMENTS

| CN | 108463887 A | 8/2018 |
| CN | 109844952 A | 6/2019 |

(Continued)

OTHER PUBLICATIONS

Makiuchi Masao JP 2001320081 A "Semiconductor Light Receiving Element", machine English translation (pp. 1-4). (Year: 2001).*

(Continued)

*Primary Examiner* — Khiem D Nguyen
(74) *Attorney, Agent, or Firm* — CHIP LAW GROUP

(57) ABSTRACT

A sensor including: a semiconductor substrate (41) having a first surface (S1) and a second surface (S2) opposed to each other, and including an avalanche photodiode; an on-chip lens (71) provided on side of the first surface (S1) of the semiconductor substrate (41); a first reflective member (73) provided on the on-chip lens (71); and a wiring layer (42) provided on side of the second surface (S2) of the semiconductor substrate (41), and including a second reflective member (104).

18 Claims, 25 Drawing Sheets

(52) U.S. Cl.
CPC .. *H01L 27/14629* (2013.01); *H01L 27/14636* (2013.01); *H01L 27/14645* (2013.01); *H01L 27/14649* (2013.01); *G01S 17/894* (2020.01)

(56) References Cited

U.S. PATENT DOCUMENTS

| | | | |
|---|---|---|---|
| 2010/0187501 A1* | 7/2010 | Toda | B82Y 20/00 |
| | | | 438/63 |
| 2011/0169117 A1 | 7/2011 | Mcintosh et al. | |
| 2013/0027593 A1* | 1/2013 | Enoki | H01L 27/14621 |
| | | | 257/E51.024 |
| 2015/0187843 A1* | 7/2015 | Hatano | H10K 39/32 |
| | | | 257/40 |
| 2017/0263793 A1* | 9/2017 | Ueno | G01S 7/4865 |
| 2018/0286908 A1 | 10/2018 | Yamazaki | |
| 2019/0027518 A1* | 1/2019 | Miyata | H01L 27/14645 |
| 2019/0342510 A1* | 11/2019 | Sano | H04N 25/77 |
| 2020/0066775 A1* | 2/2020 | Matsumoto | H01L 27/14629 |

FOREIGN PATENT DOCUMENTS

| | | |
|---|---|---|
| CN | 110447104 A | 11/2019 |
| DE | 112018000438 T5 | 10/2019 |
| EP | 3407386 A1 | 11/2018 |
| EP | 3573104 A1 | 11/2019 |
| JP | 06-077518 A | 3/1994 |
| JP | H06077518 A | 3/1994 |
| JP | H09326511 A | 12/1997 |
| JP | 2001-320081 A | 11/2001 |
| JP | 2003249632 A | 9/2003 |
| JP | 2006245606 A | 9/2006 |
| JP | 2007-249190 A | 9/2007 |
| JP | 2011-124450 A | 6/2011 |
| JP | 2014-154834 A | 8/2014 |
| JP | 2017-163023 A | 9/2017 |
| JP | 2018-088488 A | 6/2018 |
| JP | 2018-117117 A | 7/2018 |
| JP | 2018201005 A | 12/2018 |
| JP | 2019004149 A | 1/2019 |
| KR | 10-2007-0082026 A1 | 8/2007 |
| KR | 10-2019-0108099 A | 9/2019 |
| WO | 2017/126329 A1 | 7/2017 |
| WO | 2018/135320 A1 | 7/2018 |
| WO | 2018/173872 A1 | 9/2018 |

OTHER PUBLICATIONS

International Search Report and Written Opinion of PCT Application No. PCT/JP2020/003325, issued on Apr. 7, 2020, 14 pages of ISRWO.

* cited by examiner

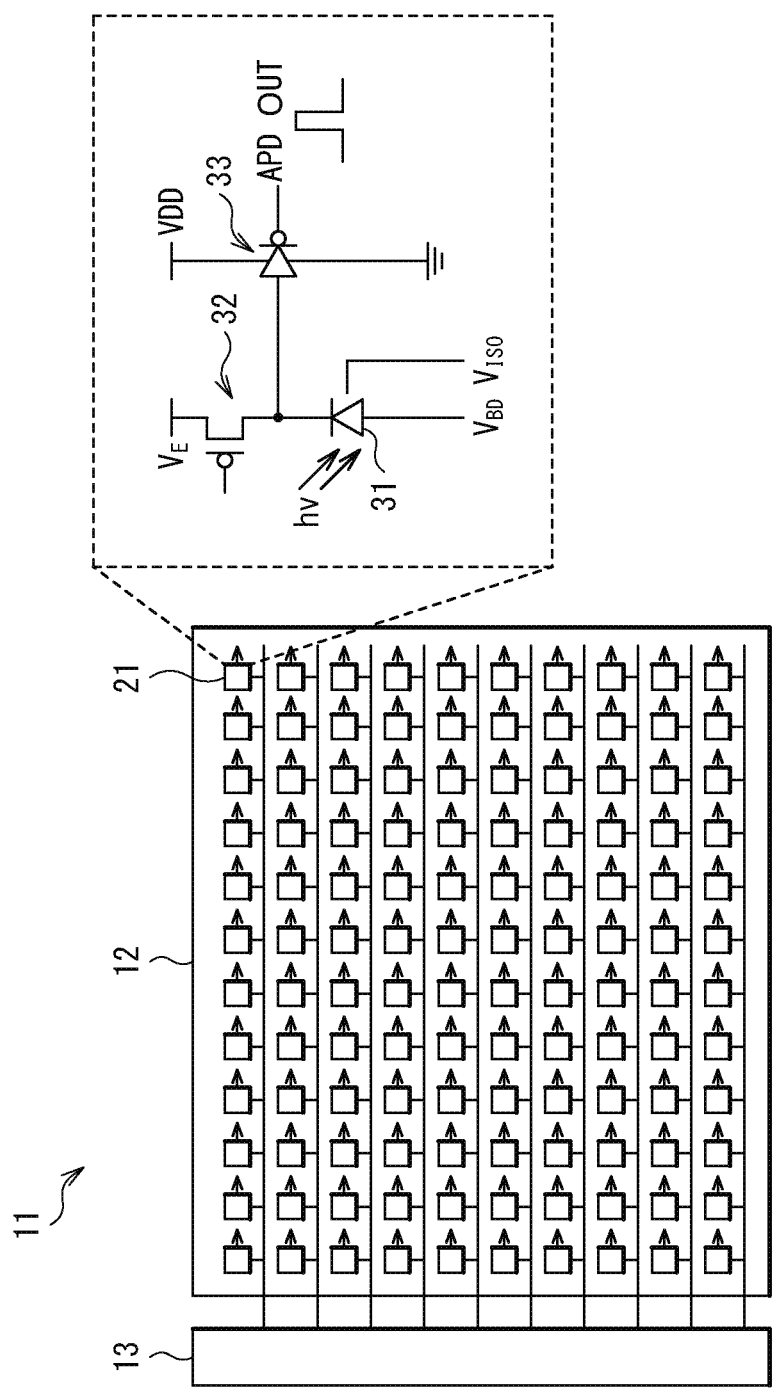
[FIG. 1]

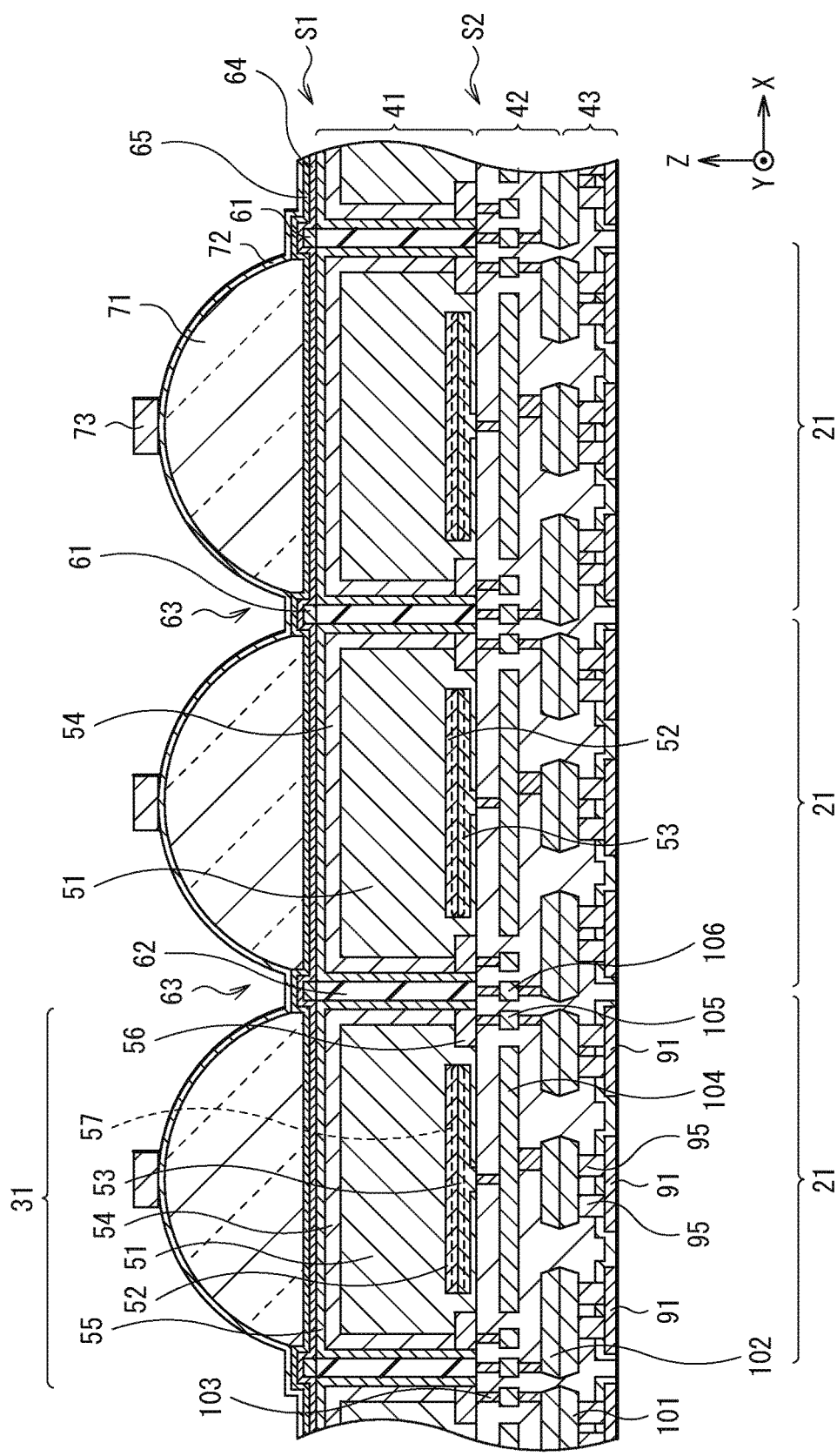
[FIG. 2]

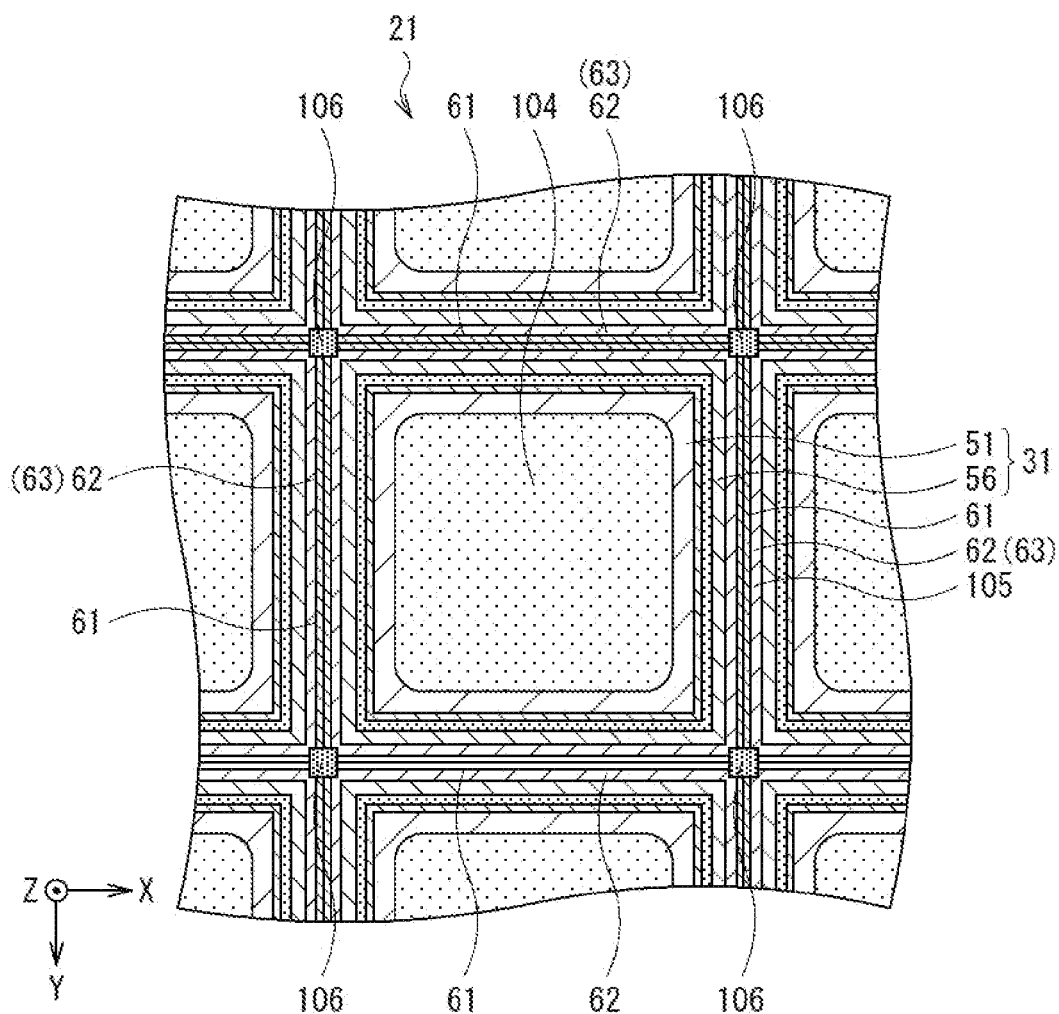
[FIG. 3]

[FIG. 4A]
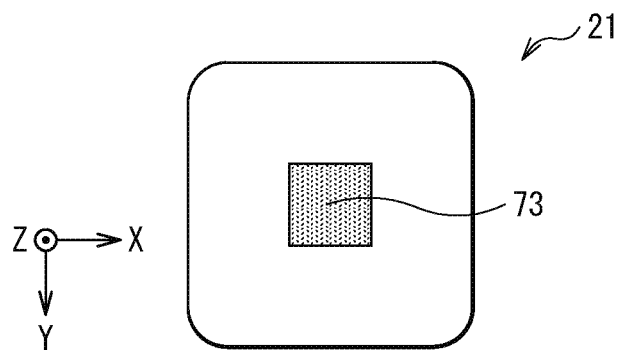
[FIG. 4B]
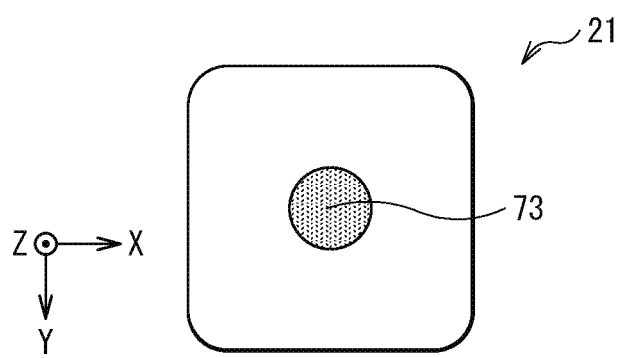
[FIG. 4C]
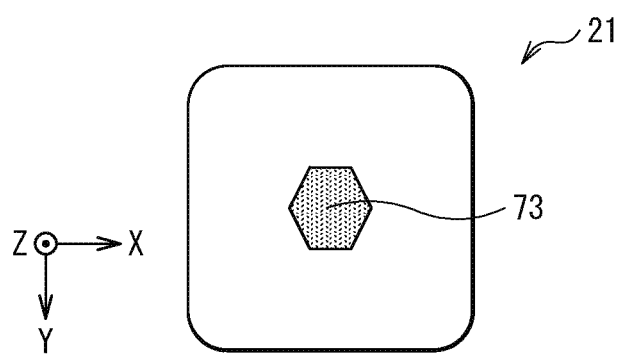

[FIG. 5]
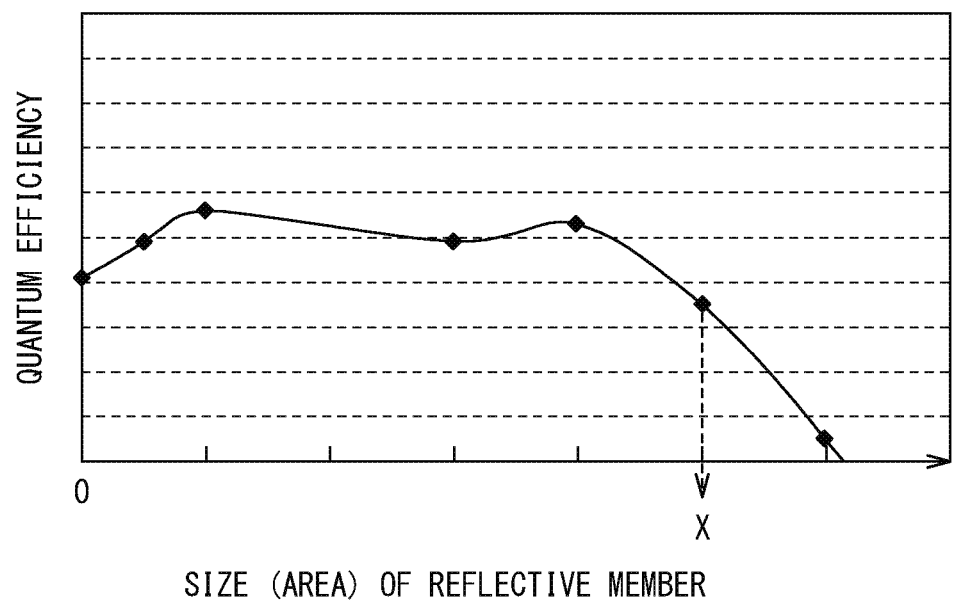

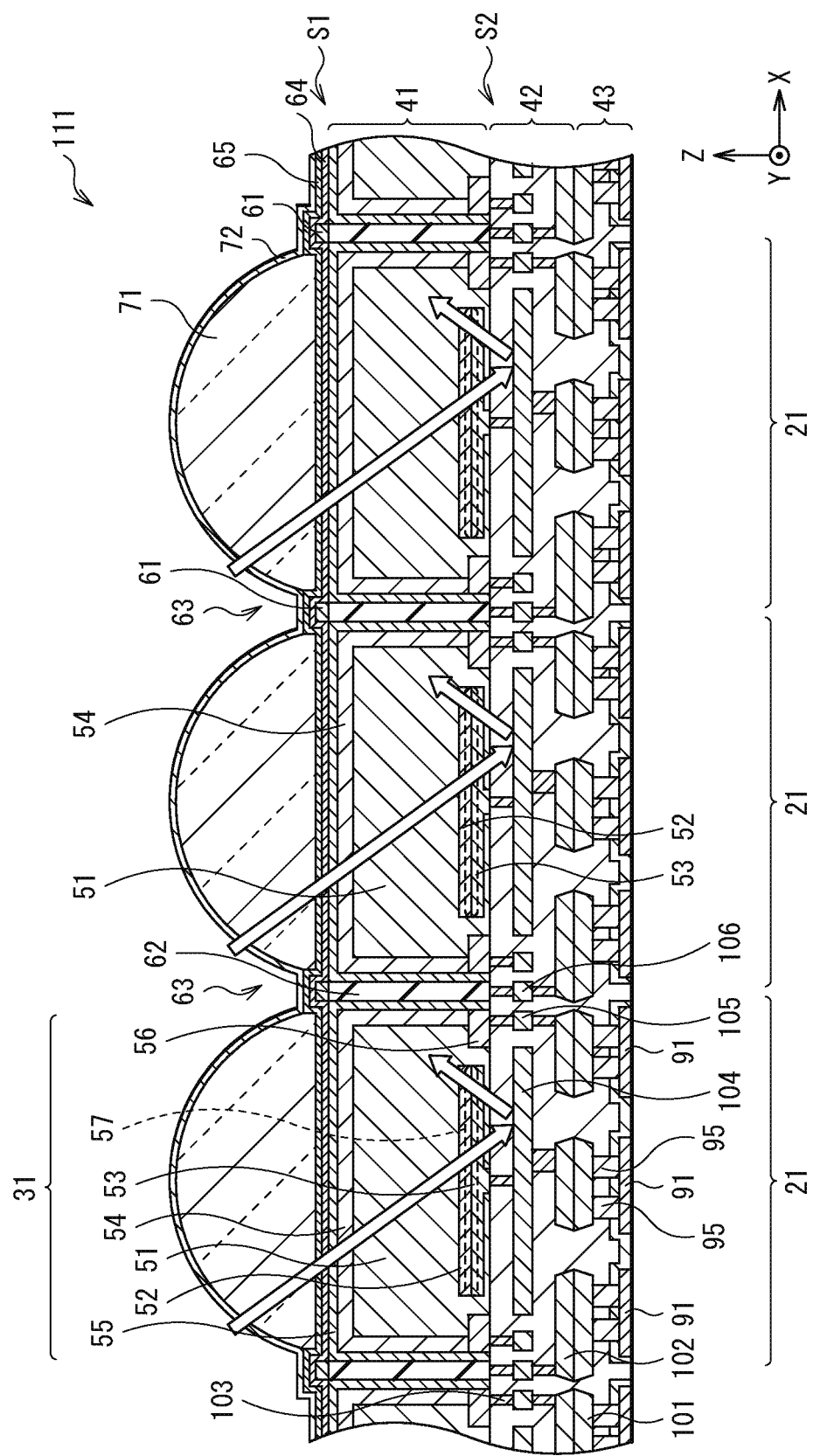
[FIG. 6]

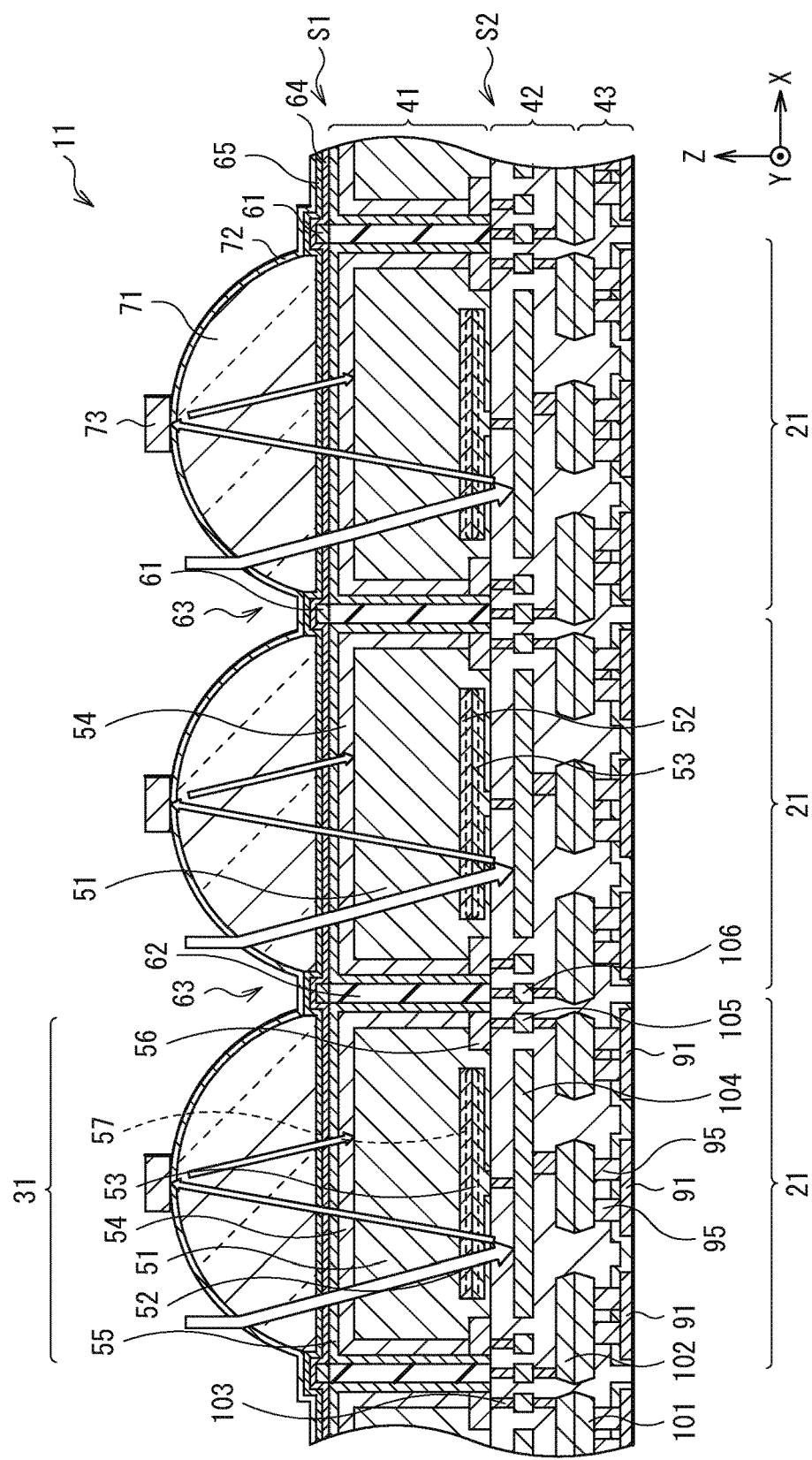
[FIG. 7]

[FIG. 8]
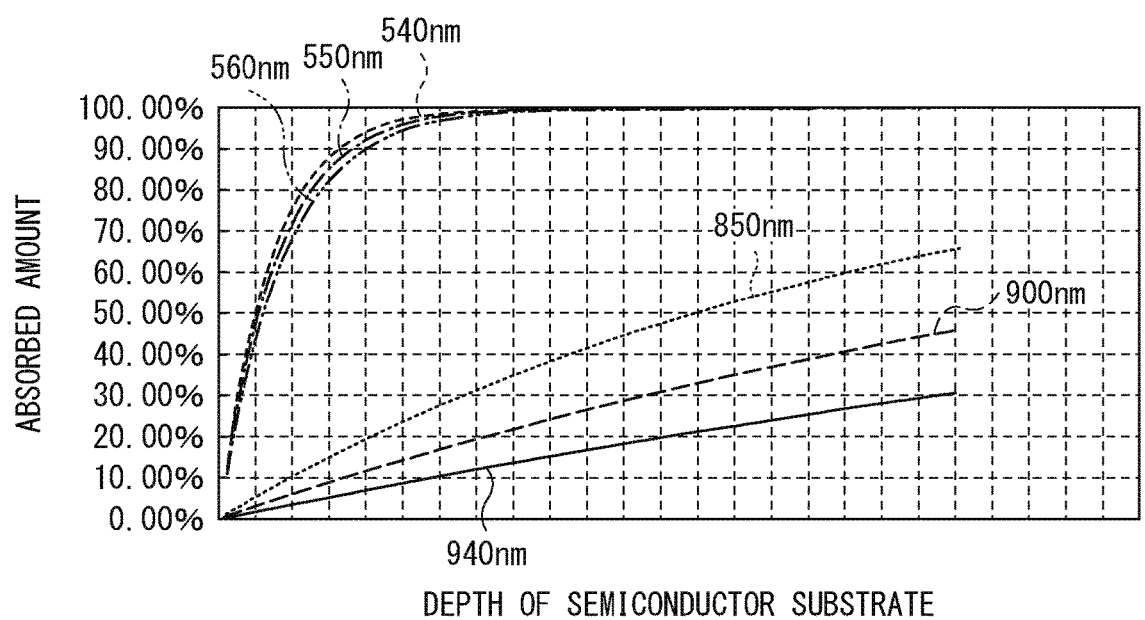

[FIG. 9]
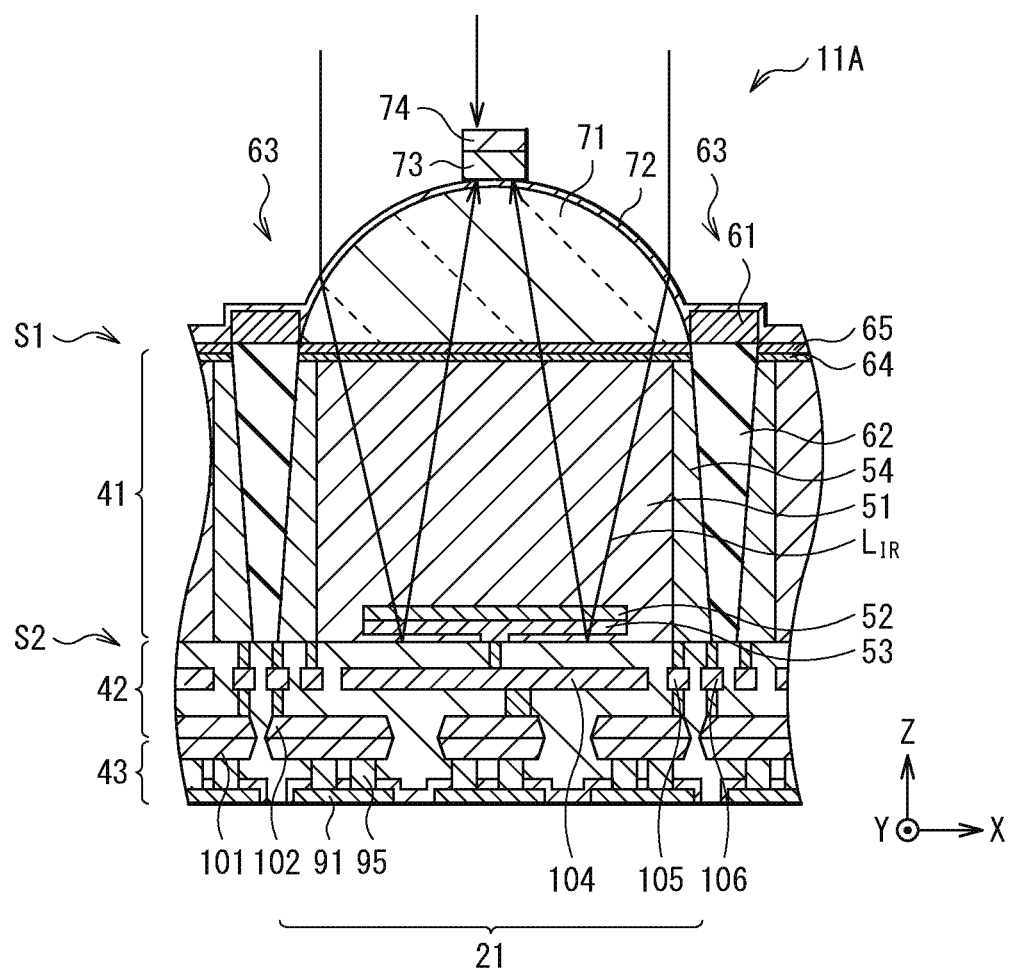

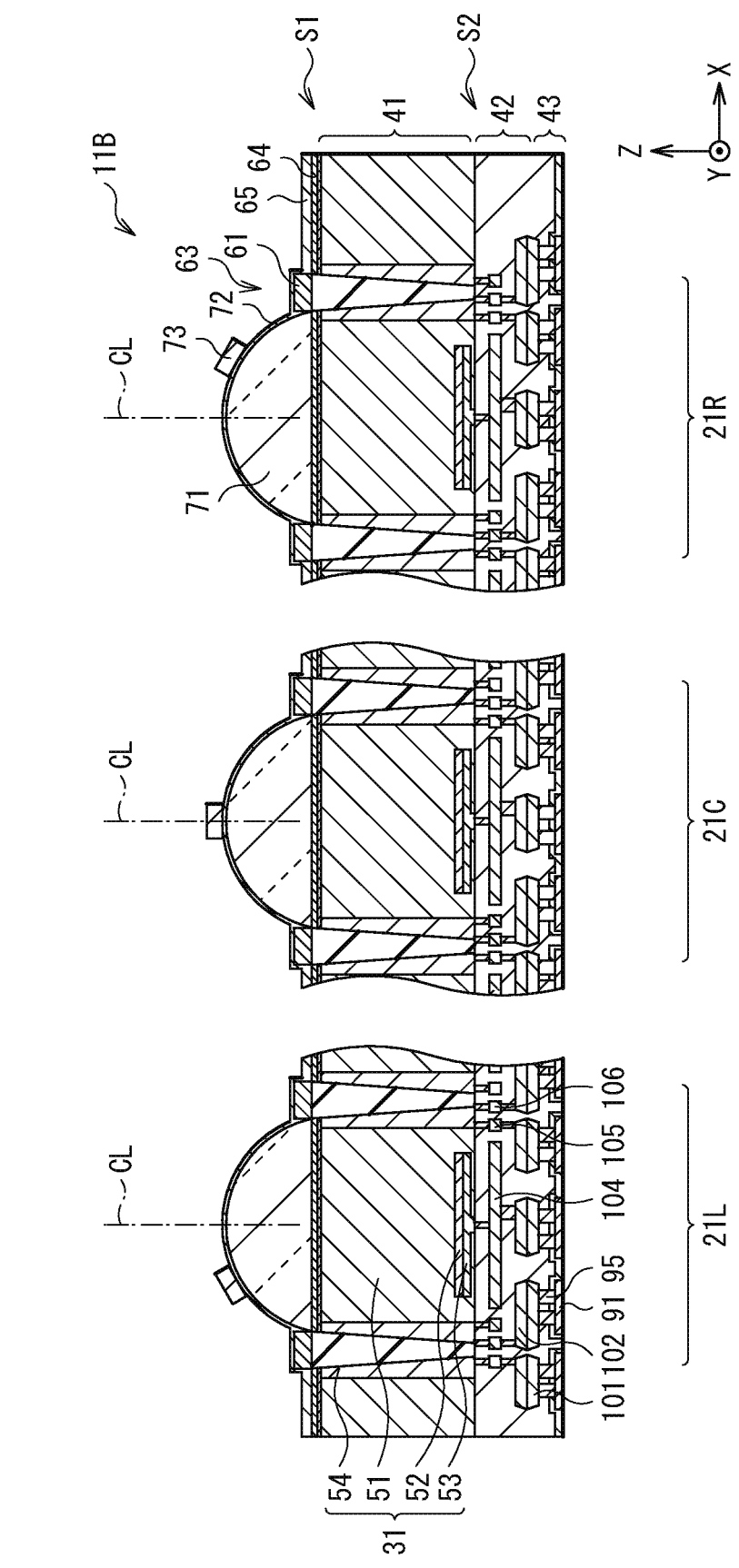

[FIG. 10B]
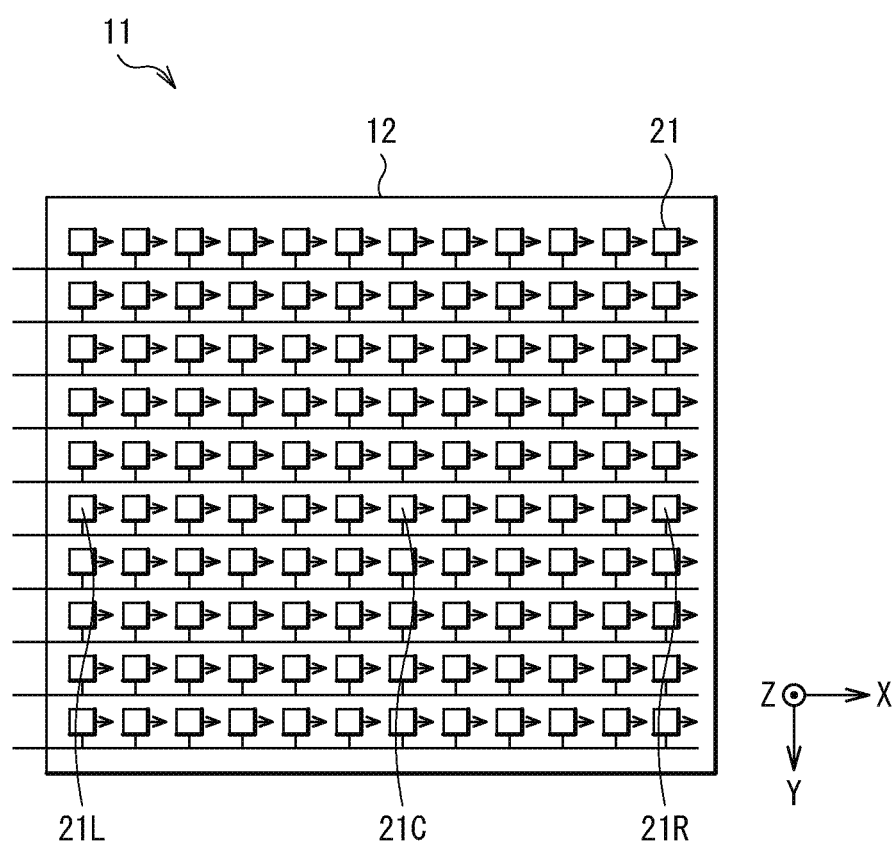

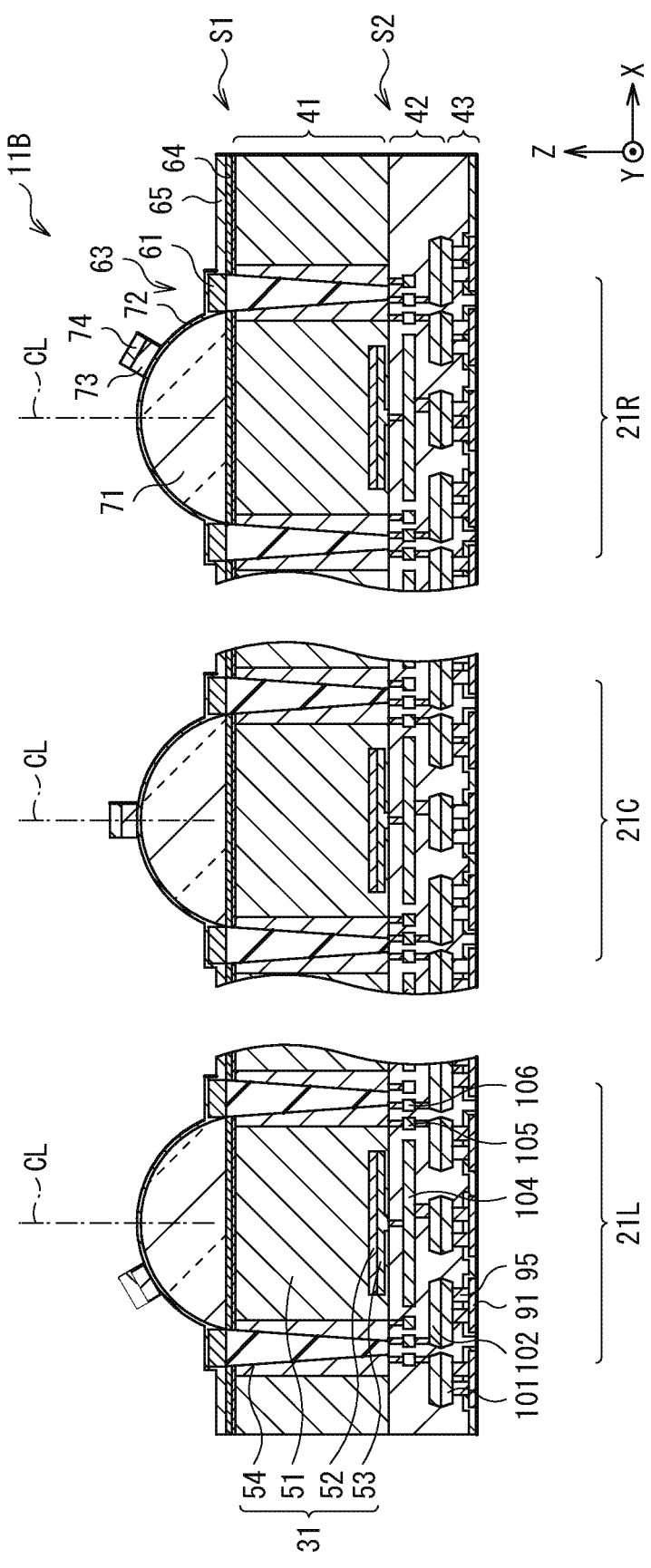

[FIG. 12A]
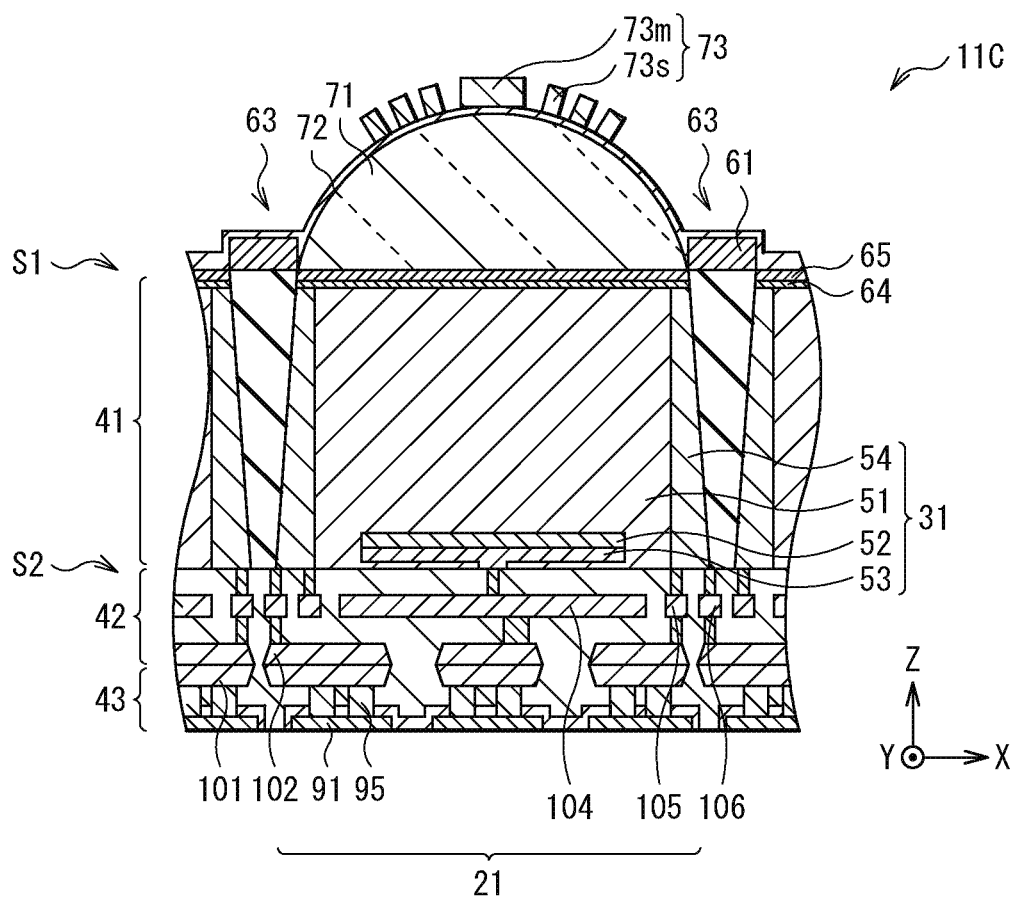
[FIG. 12B]
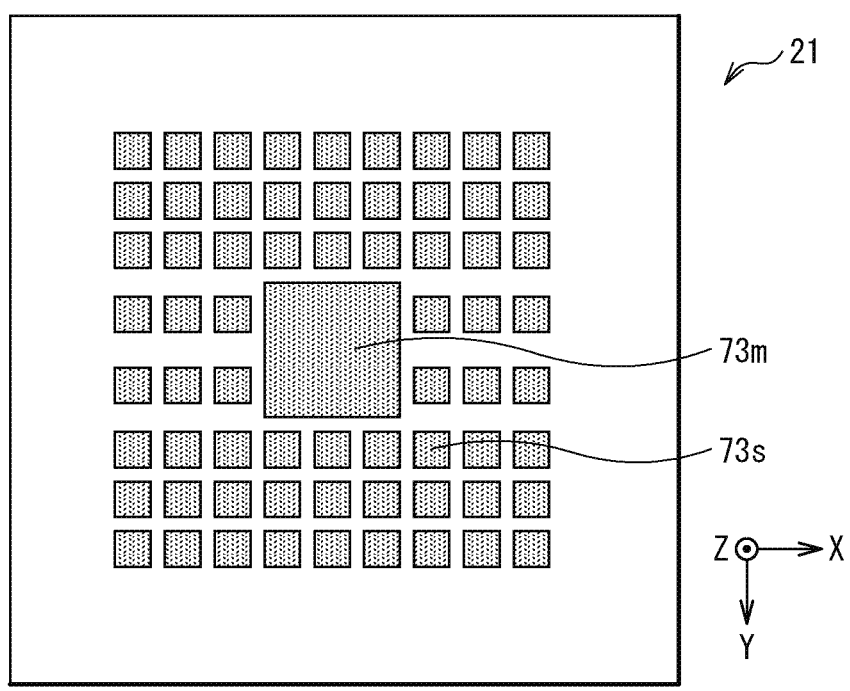

[FIG. 13]
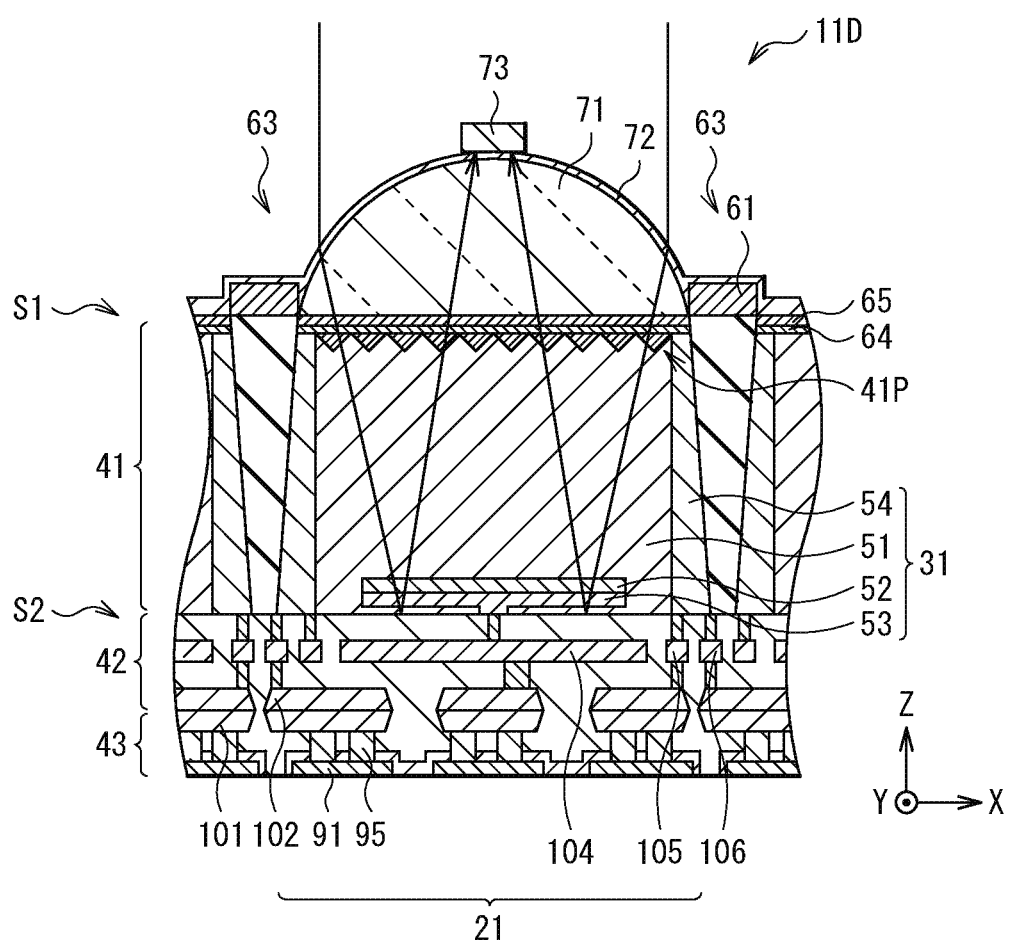

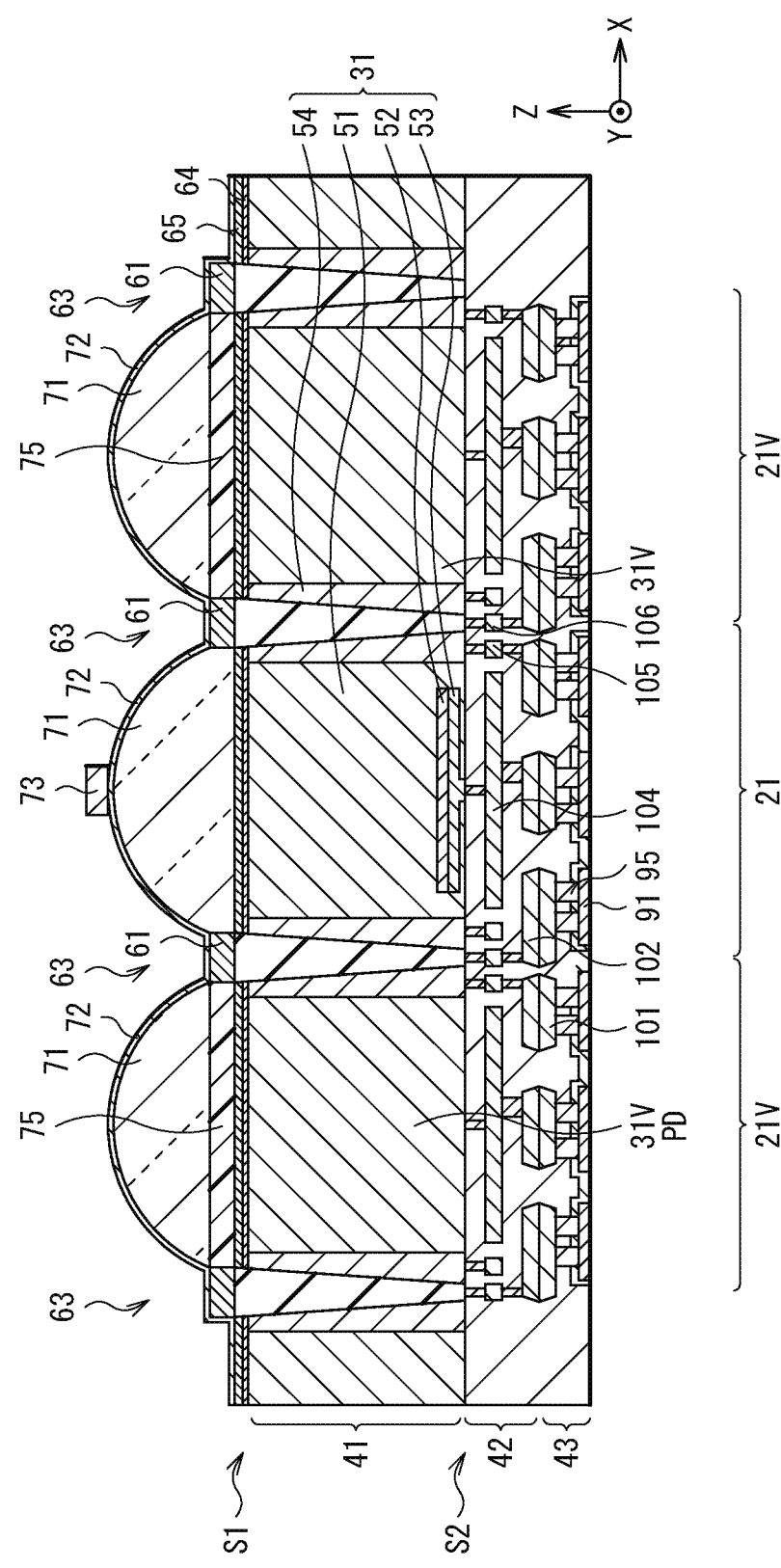
[FIG. 14]

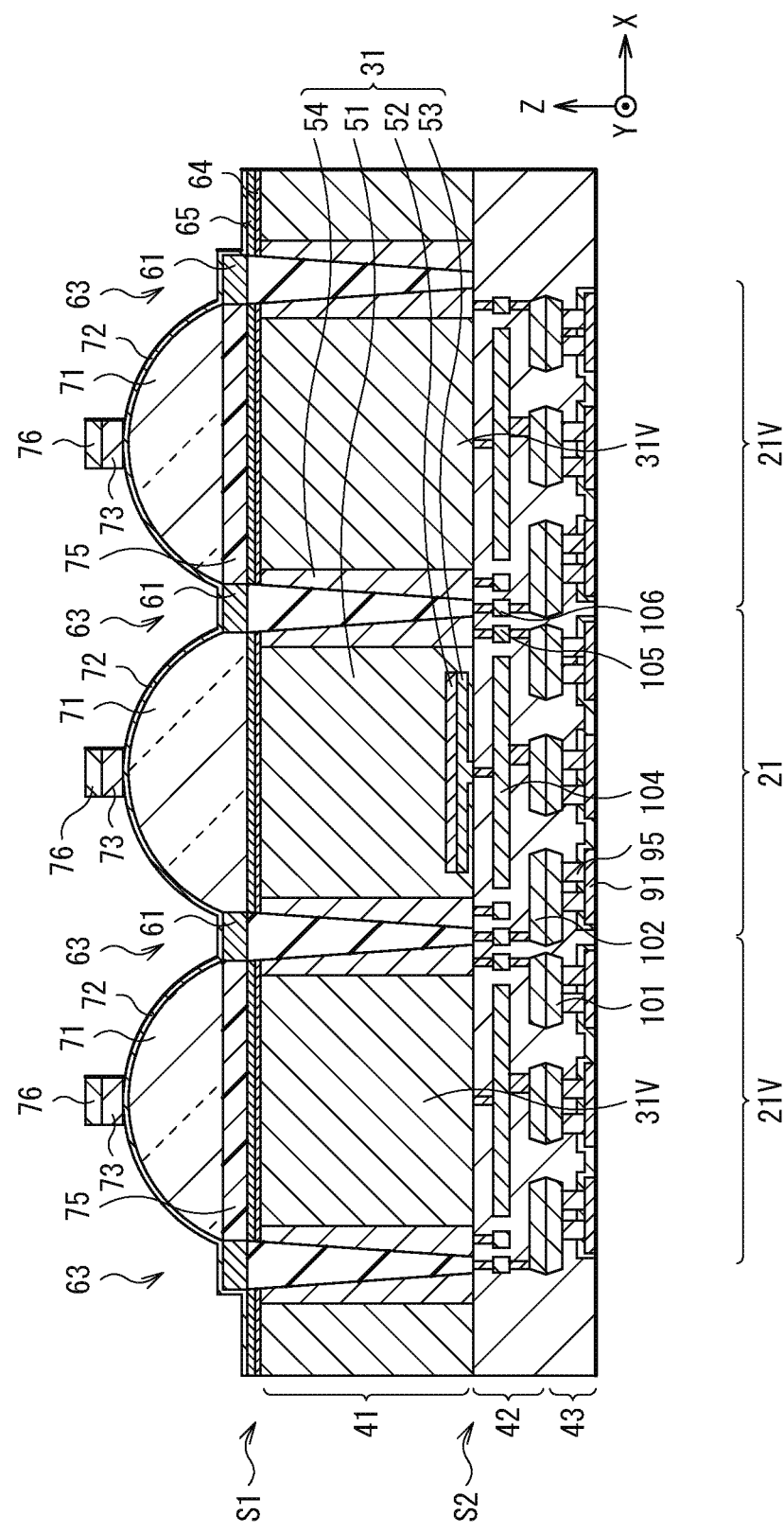
[FIG. 15]

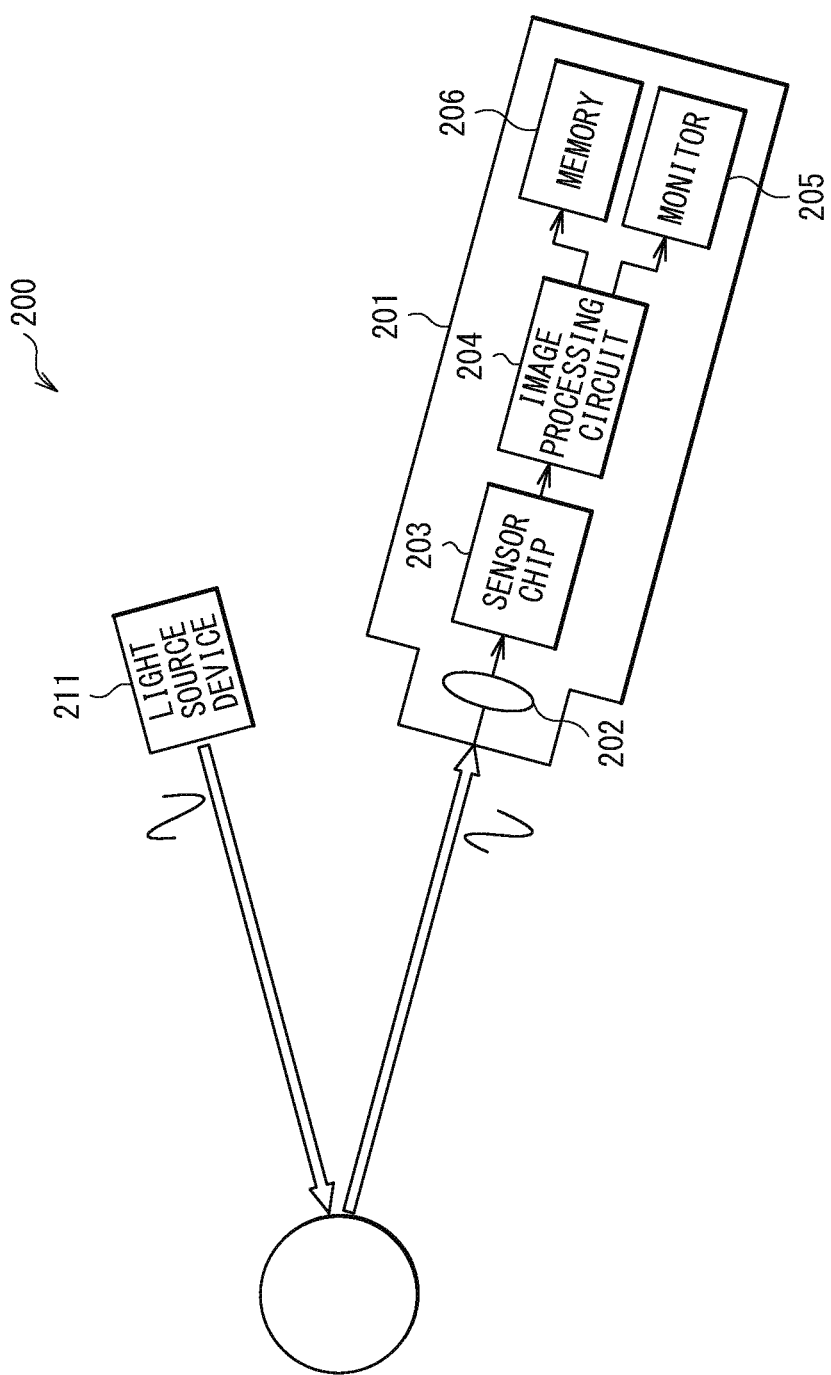
[FIG. 16]

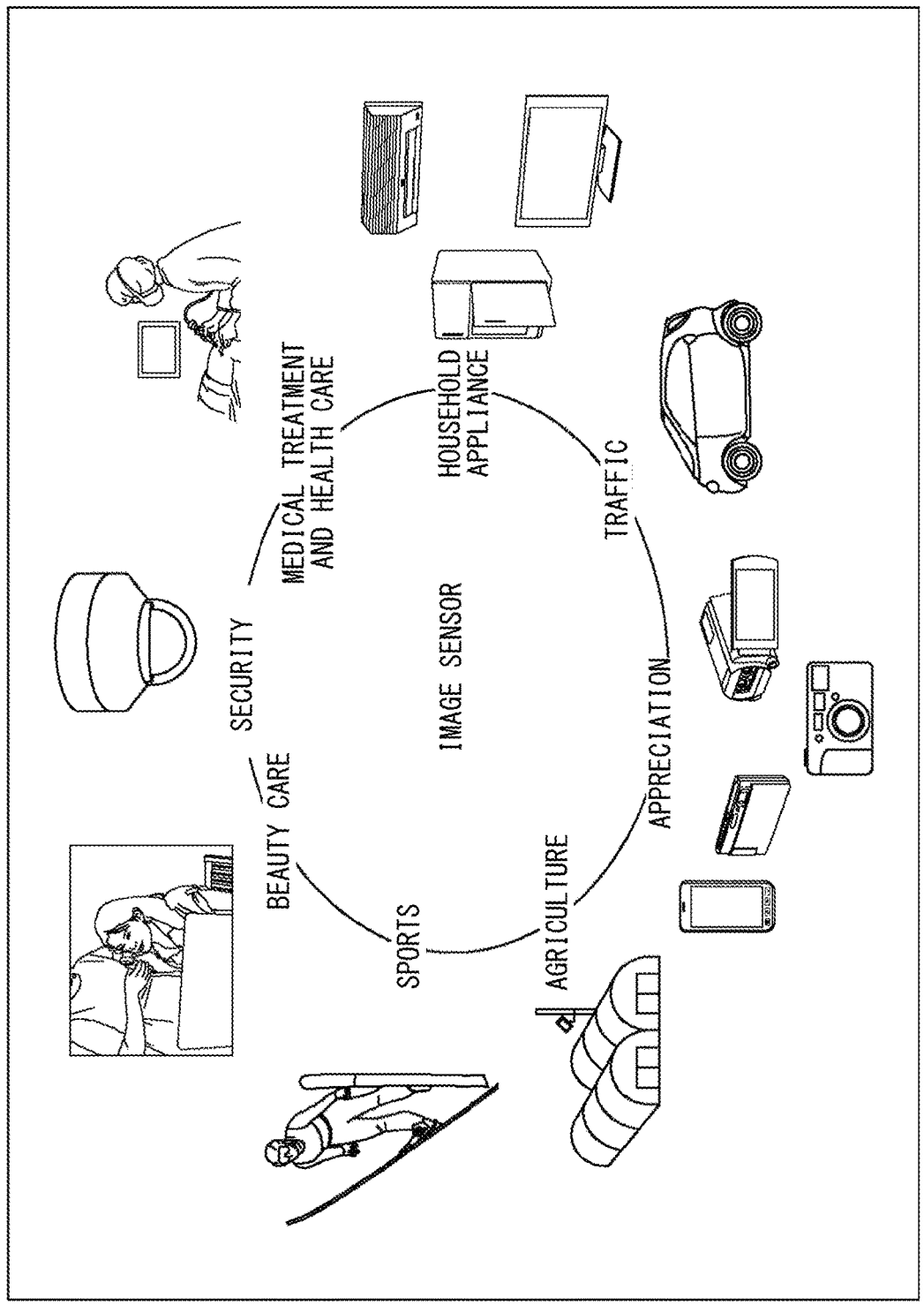
[FIG. 17]

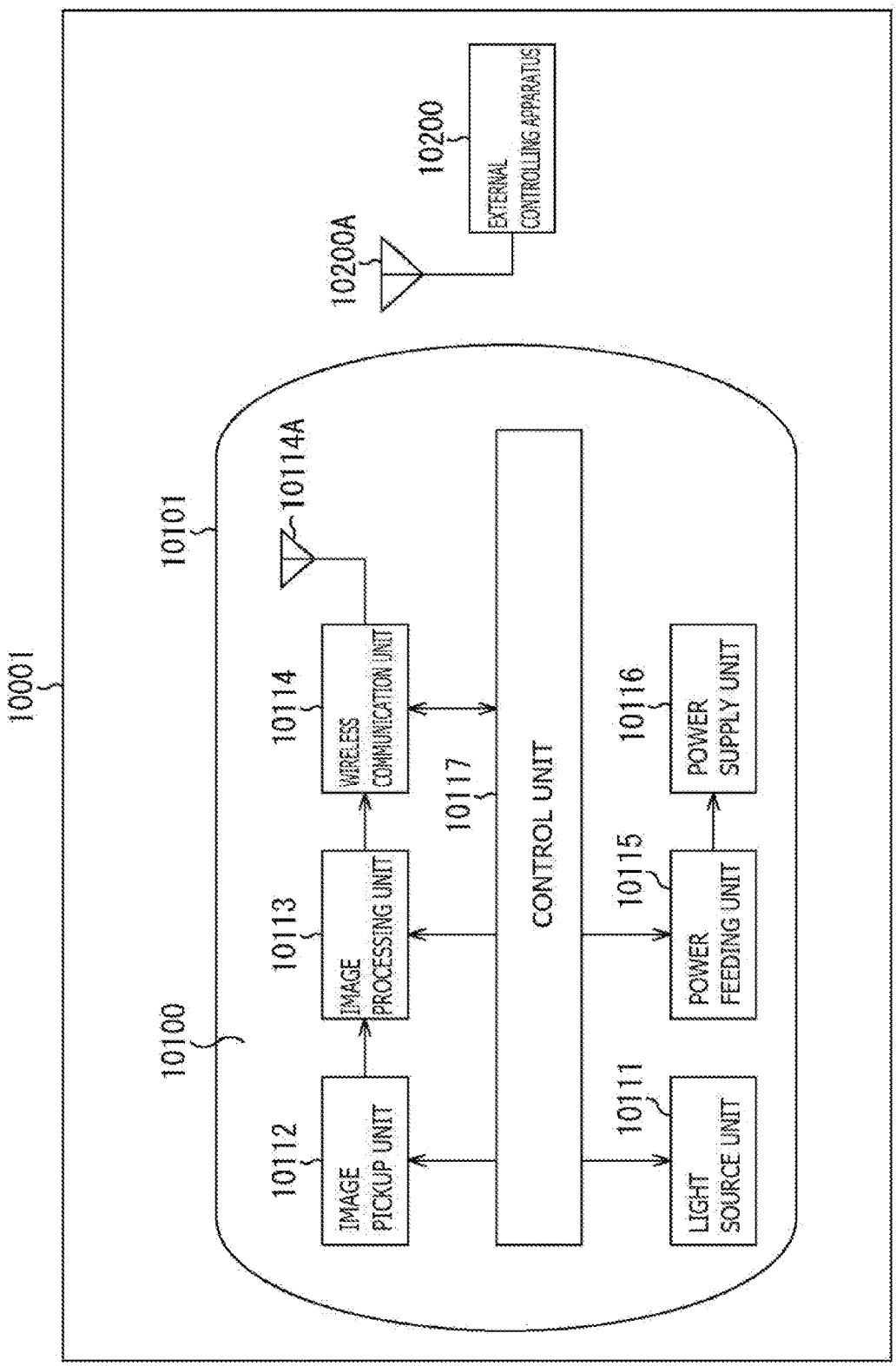
[FIG. 18]

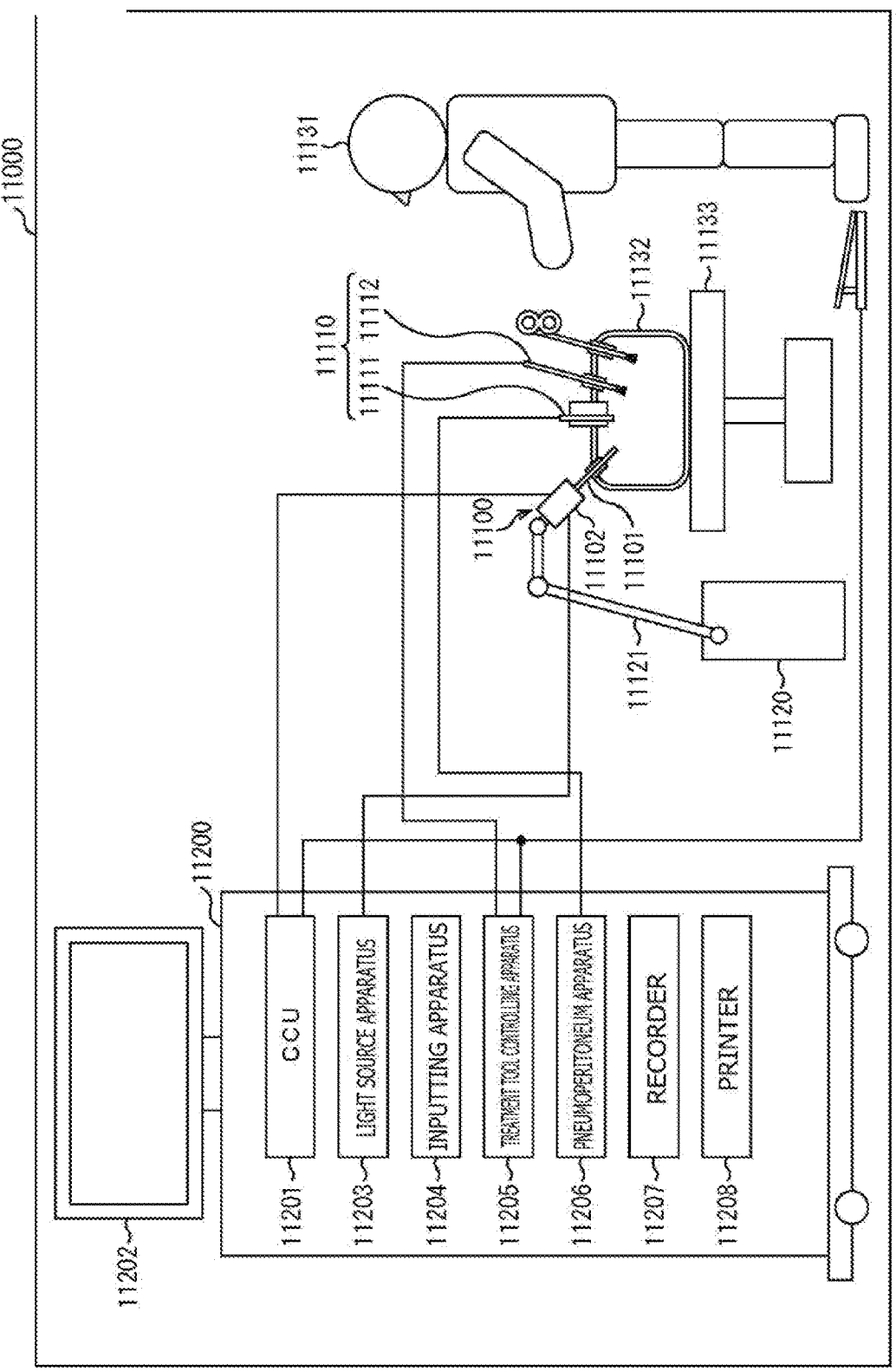
[FIG. 19]

[FIG. 20]
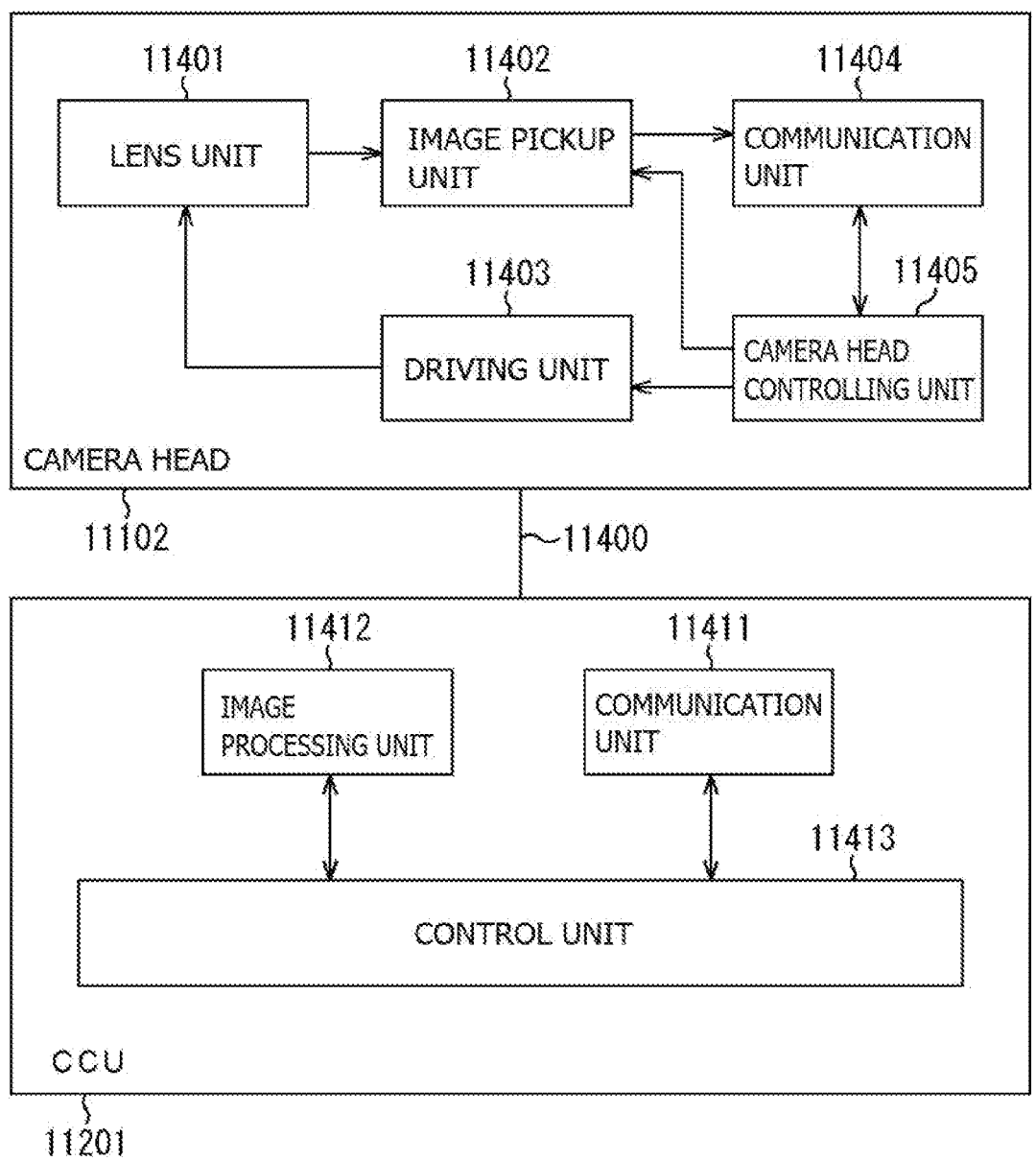

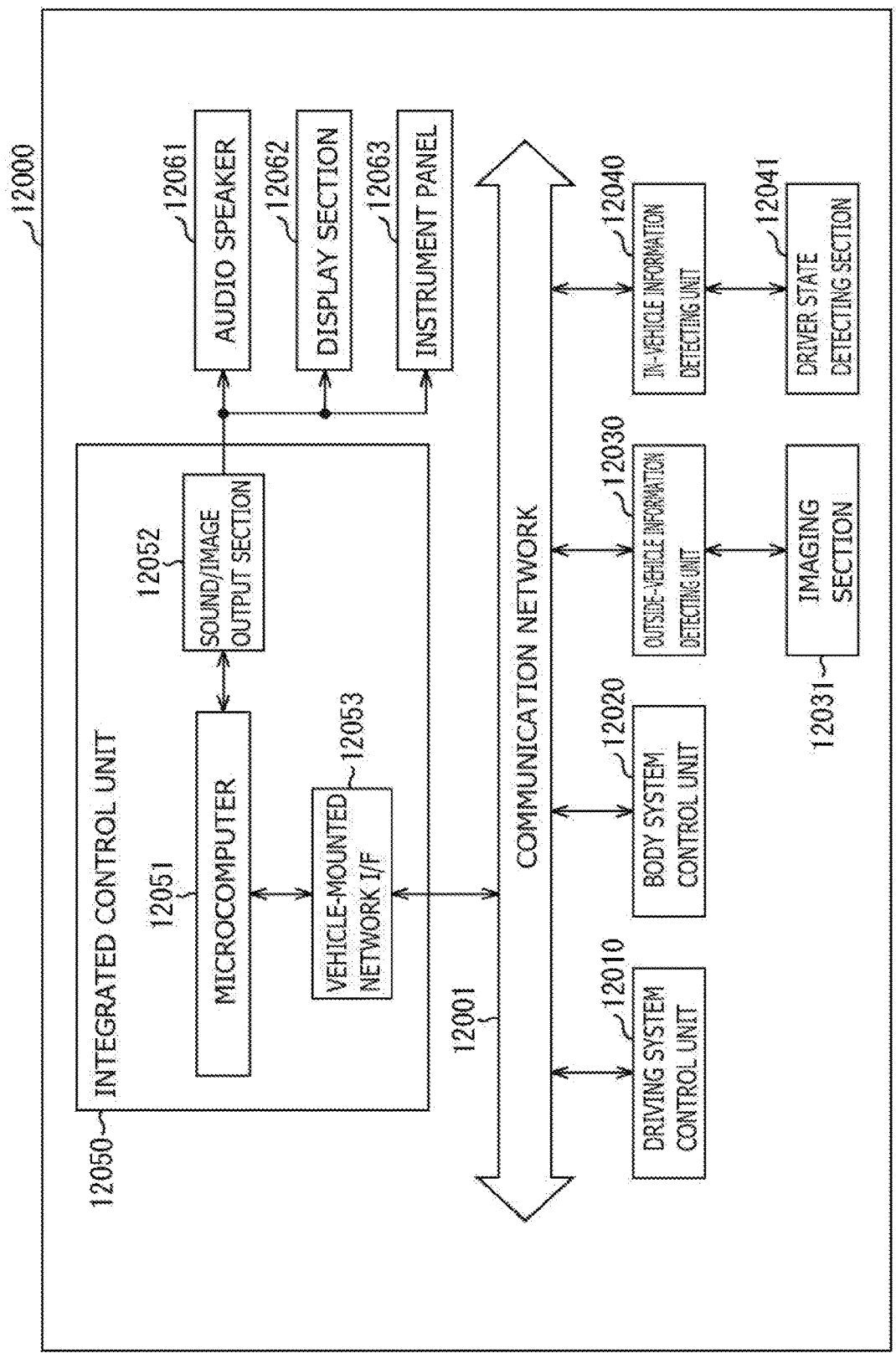
[FIG. 21]

[FIG. 22]
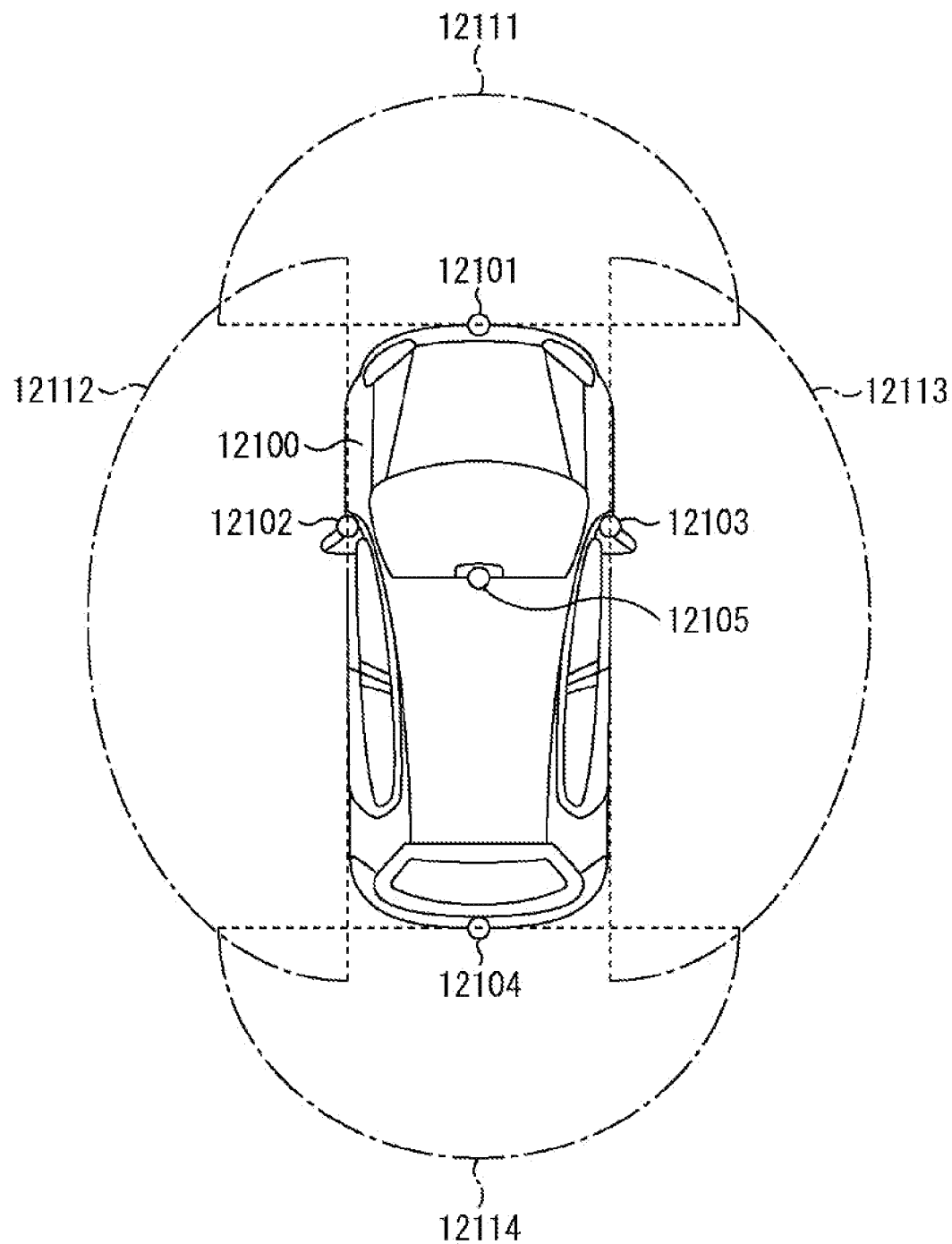

[FIG. 23]
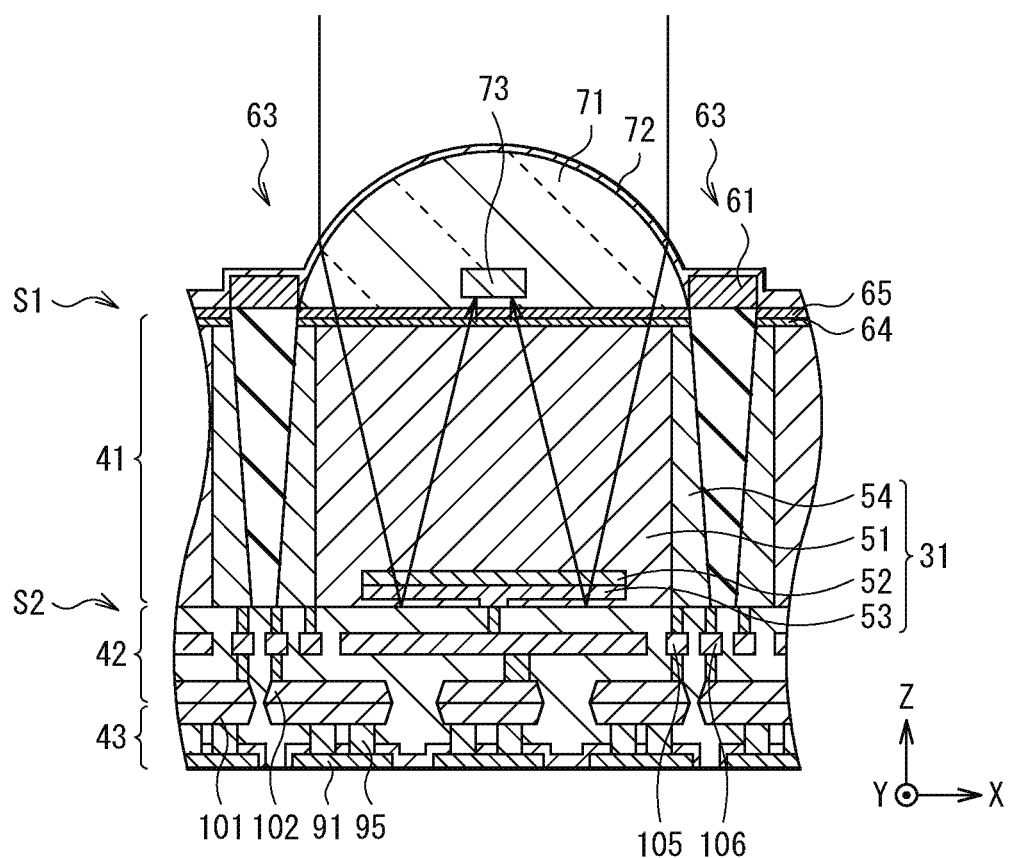

[FIG. 24]
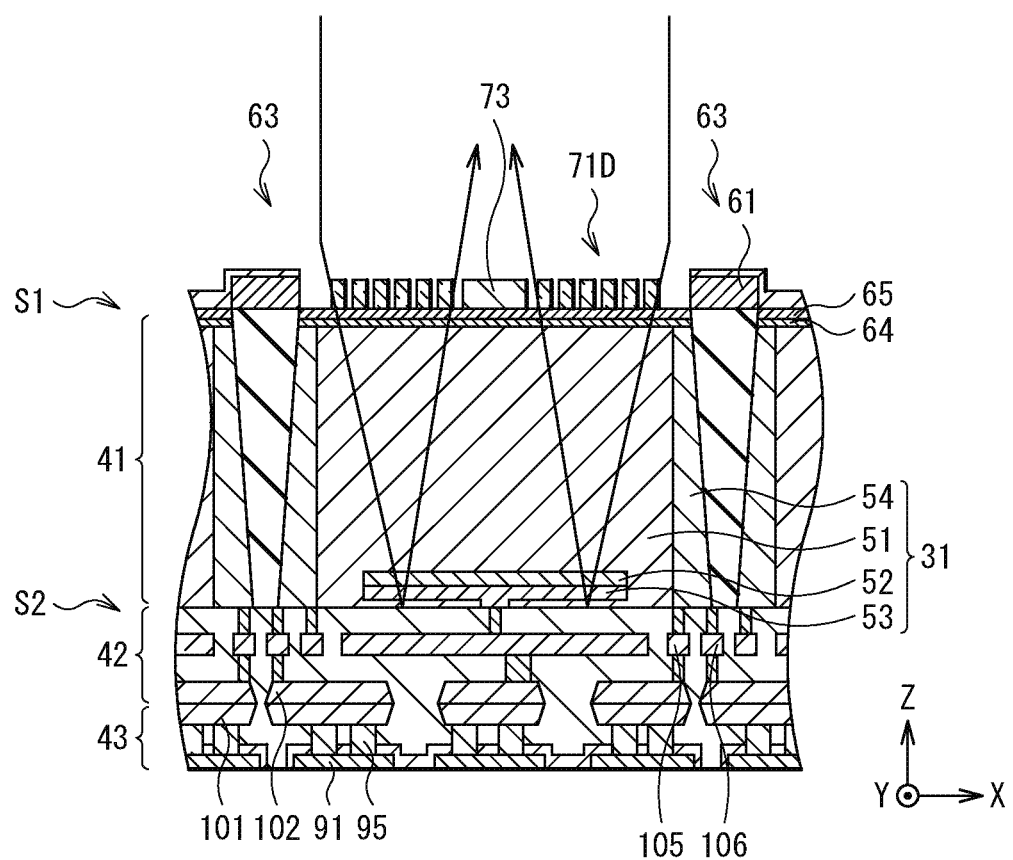

SENSOR AND DISTANCE MEASUREMENT APPARATUS HAVING AN AVALANCHE PHOTODIODE AND ON-CHIP LENS

CROSS REFERENCE TO RELATED APPLICATIONS

This application is a U.S. National Phase of International Patent Application No. PCT/JP2020/003325 filed on Jan. 30, 2020, which claims priority benefit of Japanese Patent Application No. JP 2019-040812 filed in the Japan Patent Office on Mar. 6, 2019. Each of the above-referenced applications is hereby incorporated herein by reference in its entirety.

TECHNICAL FIELD

The present technology relates to a sensor using an avalanche photodiode (APD: Avalanche Photo Diode), and a distance measurement apparatus including the sensor.

BACKGROUND ART

In recent years, development has progressed in a distance measurement apparatus that measures a distance using a ToF (Time of Flight) method. In such a distance measurement apparatus, light is irradiated from a light source to a target, and the light reflected by the target is received by a sensor. The sensor includes the APD for each pixel, for example (e.g., see PTL 1).

CITATION LIST

Patent Literature

PTL 1: Japanese Unexamined Patent Application Publication No. 2018-88488

SUMMARY OF THE INVENTION

It is desired for such a sensor to further improve sensitivity.

It is therefore desirable to provide a sensor and a distance measurement apparatus that make it possible to improve sensitivity.

A sensor according to an embodiment of the present technology includes: a semiconductor substrate having a first surface and a second surface opposed to each other, and including an avalanche photodiode; an on-chip lens provided on side of the first surface of the semiconductor substrate; a first reflective member provided on the on-chip lens; and a wiring layer provided on side of the second surface of the semiconductor substrate, and including a second reflective member.

A distance measurement apparatus according to an embodiment of the present technology includes the above-described sensor according to an embodiment of the present technology.

In the sensor and the distance measurement apparatus according to respective embodiments of the present technology, the first reflective member is provided that reflects light reflected by the second reflective member. This makes it easier for the light reflected by the second reflective member to enter the avalanche photodiode efficiently.

It is to be noted that the effects described here are not necessarily limitative, and may be any of the effects described in the present disclosure.

BRIEF DESCRIPTION OF THE DRAWINGS

FIG. 1 is a block diagram illustrating an example of a configuration of a sensor chip according to an embodiment of the present technology.

FIG. 2 is a schematic cross-sectional view of an example of a configuration of a main part of a pixel array section illustrated in FIG. 1.

FIG. 3 is a schematic plan view of an example of a configuration of a pixel illustrated in FIG. 2.

FIG. 4A is a schematic view of an example of a planar configuration of a reflective member illustrated in FIG. 2.

FIG. 4B is a schematic view of another example (1) of the planar configuration of the reflective member illustrated in FIG. 4A.

FIG. 4C is a schematic view of another example (2) of the planar configuration of the reflective member illustrated in FIG. 4A.

FIG. 5 is a schematic view of an example of a relationship between a size of the reflective member illustrated in FIG. 2 and quantum efficiency.

FIG. 6 is a schematic cross-sectional view of a configuration of a main part of a sensor chip according to a comparative example.

FIG. 7 is a schematic cross-sectional view that describes workings of the reflective member illustrated in FIG. 2.

FIG. 8 is a schematic view of an example of a relationship between a depth of a semiconductor substrate and an absorbed amount of light of each wavelength.

FIG. 9 is a schematic cross-sectional view of a configuration of a main part of a sensor chip according to Modification Example 1.

FIG. 10A is a schematic cross-sectional view of a configuration of each main part of a sensor chip according to Modification Example 2.

FIG. 10B is a schematic plan view that describes a position of each pixel illustrated in FIG. 10A.

FIG. 11 is a schematic view of another example of the cross-sectional configuration of the sensor chip illustrated in FIG. 10A.

FIG. 12A is a schematic cross-sectional view of a configuration of a main part of a sensor chip according to Modification Example 3.

FIG. 12B is a schematic view of an example of a planar configuration of a light-shielding member illustrated in FIG. 12A.

FIG. 13 is a schematic cross-sectional view of a configuration of a main part of a sensor chip according to Modification Example 4.

FIG. 14 is a schematic cross-sectional view of a configuration of a main part of a sensor chip according to Modification Example 5.

FIG. 15 is a schematic view of another example of the cross-sectional configuration of the sensor chip illustrated in FIG. 14.

FIG. 16 is a block diagram illustrating an example of a configuration of a distance measurement apparatus using the sensor chip illustrated in FIG. 1, etc.

FIG. 17 illustrates usage examples where an image sensor is used.

FIG. 18 is a block diagram depicting an example of a schematic configuration of an in-vivo information acquisition system.

FIG. 19 is a view depicting an example of a schematic configuration of an endoscopic surgery system.

FIG. 20 is a block diagram depicting an example of a functional configuration of a camera head and a camera control unit (CCU).

FIG. 21 is a block diagram depicting an example of schematic configuration of a vehicle control system.

FIG. 22 is a diagram of assistance in explaining an example of installation positions of an outside-vehicle information detecting section and an imaging section.

FIG. 23 is a schematic cross-sectional view that describes another example of the position of the reflective member illustrated in FIG. 2, etc.

FIG. 24 is a schematic cross-sectional view that describes a sensor chip provided with another light-condensing structure instead of an on-chip lens illustrated in FIG. 2, etc.

MODES FOR CARRYING OUT THE INVENTION

Hereinafter, description is given in detail of an embodiment of the present technology with reference to the drawings. It is to be noted that the description is given in the following order.
1. Embodiment (An example of a sensor chip including a reflective member on an on-chip lens)
2. Modification Example 1 (An example of including an antireflection member stacked on a reflective member)
3. Modification Example 2 (An example of including pixels with reflective members positioned differently from one another)
4. Modification Example 3 (An example of providing a plurality of separated reflective members)
5. Modification Example 4 (An example of having an inverted pyramid structure on a front surface of a semiconductor substrate)
6. Modification Example 5 (An example of including a pixel that receives light of a wavelength in a visible region)
7. Application Example (Distance Measurement Apparatus)
8. Practical Application Examples

Embodiment

[Configuration of Sensor Chip 11]

FIG. 1 is a block diagram illustrating a configuration example of a sensor chip 11 according to an embodiment of the present technology. The sensor chip 11 corresponds to a specific example of a "sensor" of the present technology.

The sensor chip 11 includes, for example, a pixel array section 12 in which a plurality of pixels 21 are provided, and a bias voltage application section 13 electrically coupled to the pixels 21. The sensor chip 11 is applied to a distance measurement apparatus (a distance measurement apparatus 200 in FIG. 16 described later), for example, and receives light of a wavelength in a near infrared region and an infrared region to generate a light-receiving signal. The wavelength in the near infrared region and the infrared region is, for example, a wavelength of 600 nm or more, and refers to wavelengths of 850 nm, 905 nm, and 940 nm, etc.

In the pixel array section 12, the plurality of pixels 21 are arranged in matrix (matrix shape), for example. Each of the pixels 21 includes, for example, an APD 31, an FET (Field Effect Transistor) 32, and an inverter 33. A large negative voltage $V_{BD}$ is applied to a cathode of the APD 31. When the negative voltage $V_{BD}$ is applied to the cathode, an avalanche multiplication region (an avalanche multiplication region 57 in FIG. 2 described later) is formed in the APD 31, and electrons generated upon incidence of a single photon are avalanche-multiplied. The FET 32 is configured by, for example, a P-type MOSFET (Metal Oxide Semiconductor Field Effect Transistor). The FET 32 is electrically coupled to the APD 31. When voltages of electrons avalanche-multiplied in the APD 31 reach the negative voltage $V_{BD}$, the FET 32 emits electrons of the APD 31, and returns the APD 31 to an initial voltage $V_E$. That is, the FET 32 performs quenching (quenching) of the APD 31. The inverter 33 is configured by, for example, a CMOS (Complementary Metal Oxide Semiconductor) inverter. The inverter 33 is electrically coupled to the APD 31. The inverter 33 shapes the voltage generated by the electrons multiplied in the APD 31, and outputs a light-receiving signal (APD OUT). The light-receiving signal is a pulse waveform to be generated, with an arrival time of a single photon as a starting point.

The bias voltage application section 13 is electrically coupled to each of the plurality of pixels 21. The bias voltage application section 13 applies a bias voltage to each of the plurality of pixels 21.

FIG. 2 illustrates an example of a cross-sectional configuration of the pixel array section 12 of the sensor chip 11. FIG. 2 illustrates three pixels 21. The sensor chip 11 is configured by, for example, a stacked body of a semiconductor substrate 41 (sensor substrate), a wiring layer 42 on sensor side, a wiring layer 43 on logic side, and a semiconductor substrate on the logic side (logic circuit substrate; not illustrated). Here, the semiconductor substrate 41 corresponds to a specific example of a semiconductor substrate of the present disclosure, and the wiring layer 42 corresponds to a specific example of a wiring layer of the present disclosure. The semiconductor substrate 41 has a first surface S1 and a second surface S2 opposed to each other, and the wiring layer 42 and the wiring layer 43 are stacked in this order on side of the second surface S2 of the semiconductor substrate 41. The first surface S1 of the semiconductor substrate 41 constitutes a light-receiving surface. The sensor chip 11 further includes an antireflection film 64, an oxide film 65, and an on-chip lens 71 on side of the first surface S1 of the semiconductor substrate 41. The sensor chip 11 has a so-called back-illuminated type configuration.

The semiconductor substrate 41 is configured by, for example, a single-crystal silicon (Si). The semiconductor substrate 41 includes the APD 31 for each of the pixels 21. The APD 31 includes, for example, an N-well region 51, a P-type diffusion layer 52, an N-type diffusion layer 53, a hole accumulation layer 54, a pinning layer 55, and a P-type region 56. The semiconductor substrate 41 includes a pixel separation part 63 that separates neighboring APDs 31. The pixel separation part 63 is configured by a groove penetrating the semiconductor substrate 41 from the first surface S1 to the second surface S2, for example. An insulating film 62 is buried in the groove of the pixel separation part 63.

The N-well region 51 is provided widely across a thickness direction of the semiconductor substrate 41 (a Z-axis direction in FIG. 2). The N-well region 51 forms an electric field that transfers electrons generated by photoelectric conversion to an avalanche multiplication region (avalanche multiplication region 57 described later). A P-well region may be provided instead of the N-well region 51 (illustration omitted)

The P-type diffusion layer 52 and the N-type diffusion layer 53 are provided in the vicinity of the second surface S2 of the semiconductor substrate 41. The P-type diffusion layer 52 and the N-type diffusion layer 53 are provided to be stacked on each other, and, for example, the N-type diffusion layer 53 is disposed at a position closer to the second surface S2 than the P-type diffusion layer 52. The P-type diffusion layer 52 and the N-type diffusion layer 53 are widely provided in the pixel 21, in a plan view (an X-Y plane in FIG. 2). The P-type diffusion layer 52 is a layer in which P-type impurities are diffused in a dense concentration, and the N-type diffusion layer 53 is a layer in which N-type impurities are diffused in a dense concentration. A depletion layer is formed in a region where the P-type diffusion layer 52 and the N-type diffusion layer 53 are coupled to each other. The avalanche multiplication region 57 is formed in this depletion layer. The N-type diffusion layer 53 is electrically coupled to a wiring line (a wiring line 104 described later) of the wiring layer 42, and the negative voltage $V_{BD}$ is applied from this wiring line to the N-type diffusion layer 53. In order to establish the coupling to this wiring line, the N-type diffusion layer 53 may have a convex shape to allow a portion thereof to extend to the second surface S2 of the semiconductor substrate 41.

As described above, the avalanche multiplication region 57 is formed on a boundary surface between the P-type diffusion layer 52 and the N-type diffusion layer 53. The avalanche multiplication region 57 is a high electric field region formed by the negative voltage VBD to be applied to the N-type diffusion layer 53. The avalanche multiplication region 57 multiplies electrons (e⁻) to be generated when a single photon enters the APD 31.

The hole accumulation layer 54 is provided, for example, between the N-well region 51 and the first surface S1 and between the N-well region 51 and the pixel separation part 63. The hole accumulation layer 54 is a layer in which P-type impurities are diffused and in which holes are accumulated. The hole accumulation layer 54 is electrically coupled to a wiring line (a wiring line 105 described later) of the wiring layer 42 via the P-type region 56 to allow bias adjustment to be performed.

The pinning layer 55 is provided between the hole accumulation layer 54 and the first surface S1 and between the hole accumulation layer 54 and the pixel separation part 63. The pinning layer 55 is a layer in which P-type impurities are diffused in a dense concentration. When the hole concentration of the hole accumulation layer 54 becomes high as a result of the bias adjustment of the hole accumulation layer 54, pinning by the pinning layer 55 becomes strong. This makes it possible to suppress generation of a dark current, for example.

The P-type region 56 is a layer in which P-type impurities are diffused in a dense concentration, and is provided in the vicinity of the second surface S2 of the semiconductor substrate 41.

FIG. 3 schematically illustrates an example of a planar configuration of the pixel 21. The P-type region 56 is provided, for example, to surround the N-well region 51, in a plan view. Th P-type region 56 electrically couples the wiring line 105 of the wiring layer 42 and the hole accumulation layer 54 to each other.

The pixel separation part 63 is provided in a grid form in a plan view, for example, to partition the APDs 31 (FIG. 3). The insulating film 62 buried in the groove of the pixel separation part 63 is provided, for example, entirely across the thickness direction of the semiconductor substrate 41. The insulating film 62 is configured by silicon oxide (SiO), or the like, for example. Providing the pixel separation part 63 in which the insulating film 62 is buried makes it possible to suppress occurrence of crosstalk between neighboring APDs 31. Although illustration is omitted, a metal film may be provided over the groove of the pixel separation part 63 with the insulating film 62 interposed therebetween. Alternatively, a void part may be provided, together with the insulating film 62 and the metal film, in the groove of the pixel separation part 63.

A light-shielding film 61 is provided on the pixel separation part 63 on the side of the first surface S1 of the semiconductor substrate 41. The light-shielding film 61 is provided in a grid form, for example, to overlap the pixel separation part 63, in a plan view. Providing such a light-shielding film 61 makes it possible to suppress occurrence of crosstalk caused by oblique incident light. The light-shielding film 61 may be embedded in the groove of the pixel separation part 63. The light-shielding film 61 embedded in the groove of the pixel separation part 63 may be integrally formed with the light-shielding film 61 on the pixel separation part 63. In addition, a void (void) may be provided inside the light-shielding film 61 embedded in the groove of the pixel separation part 63. A material having a light-shielding property with respect to light of a wavelength in a near infrared region and an infrared region may be used for the light-shielding film 61; for example, tungsten (W), or the like may be used.

The wiring layer 42 includes, for example, a metal pad 102, a contact electrode 103, and a plurality of wiring lines (wiring lines 104, 105, and 106), as well as an interlayer insulating film which separates them from one another.

The metal pad 102 is exposed to a bonding surface between the wiring layer 42 and the wiring layer 43, and is bonded to a metal pad (a metal pad 101 described later) of the wiring layer 43. This allows the wiring layer 42 and the wiring layer 43 to be bonded together mechanically and electrically. The metal pad 102 is configured by, for example, copper (Cu), and the bonding between the wiring layer 42 and the wiring layer 43 is formed by Cu—Cu bonding.

The contact electrode 103 is used, for example, for coupling between the semiconductor substrate 41 (specifically, the N-type diffusion layer 53 and the P-type region 56) and the wiring lines (e.g., the wiring lines 104 and 105) of the wiring layer 42, or for coupling between the wiring lines of the wiring layer 42 and the metal pad 102.

The wiring line 104 of the wiring layer 42 is electrically coupled to the N-type diffusion layer 53 of the semiconductor substrate 41 via the contact electrode 103. That is, the wiring line 104 functions as a cathode of the APD 31, and is provided for each of the pixels 21. The wiring line 104 is opposed to the on-chip lens 71 with the APD 31 interposed therebetween. Here, the wiring line 104 is reflective to light of a wavelength in a near infrared region and an infrared region. Specifically, copper (Cu), aluminum (Al), or the like may be used for the wiring line 104. Providing such a wiring line 104 in the wiring layer 42 allows light having passed through the semiconductor substrate 41 to be reflected by the wiring line 104 and to propagate toward the semiconductor substrate 41, without being subjected to photoelectric conversion. Here, the wiring line 104 corresponds to a specific example of a second reflective member of the present technology.

The wiring line 104 is preferably provided at a position overlapping the avalanche multiplication region 57 to be wider than the avalanche multiplication region 57, in a plan view. For example, the wiring line 104 is provided to cover substantially the entire surface of the pixel 21 inside the P-type region 56, in a plan view (FIG. 3).

The wiring line 105 of the wiring layer 42 is electrically coupled to the P-type region 56 of the semiconductor substrate 41 via the contact electrode 103. That is, the wiring line 105 functions as an anode of the APD 31. The wiring line 105 is disposed, for example, at a position overlapping the P-type region 56, and surrounds the wiring 104, in a plan view.

For example, a wiring line (the wiring line 106) may be provided at a position overlapping the pixel separation part 63, in a plan view. The wiring line 106 is disposed, for example, at each corner of the pixel 21 (FIG. 3). The light-shielding film 61 may be embedded in the groove of the pixel separation part 63 to cause the light-shielding film 61 to be electrically coupled to the wiring line 106.

The wiring lines 104, 105, and 106 are each electrically coupled to the metal pad 102 via the contact electrode 103.

The wiring layer 43 includes, for example, an electrode pads 91, a contact electrode 95, and the metal pad 101, as well as an interlayer insulating film that separates them from one another.

The electrode pad 91 is provided at a position distant from the second surface S2 of the semiconductor substrate 41 than the metal pad 101, and is coupled to a circuit substrate of the wiring layer 43. The contact electrode 95 couples the electrode pad 91 and the metal pad 101 together. The metal pad 101 is bonded to the metal pad 102 of the wiring layer 42 at a bonding surface between the wiring layer 43 and the wiring layer 42. That is, the APD 31 is electrically coupled to the wiring layer 43 via the wiring layer 42.

The on-chip lens 71 is provided over the first surface S1 of the semiconductor substrate 41 with the antireflection film 64 and the oxide film 65 interposed therebetween. The antireflection film 64 is provided, for example, between the semiconductor substrate 41 (first surface S1) and the oxide film 65, and covers substantially the entire surface of the first surface S1 of the semiconductor substrate 41. Providing the antireflection film 64 makes it possible to suppress reflection of light having passed through the on-chip lens 71 by the first surface S1 of the semiconductor substrate 41. For example, a barrier metal such as titanium nitride (TiN) as well as silicon nitride (SiN), silicon oxynitride (SiON), or the like may be used for the antireflection film 64. The oxide film 65 covers the entire surface of the first surface S1 of the semiconductor substrate 41, for example, with the antireflection film 64 interposed therebetween. For example, silicon oxide (SiO) or the like may be used for the oxide film 65.

The on-chip lens 71 is provided for each of the pixels 21. The on-chip lens 71 covers each APD 31 from the side of the first surface S1. The on-chip lens 71 condenses incident light on the APD 31 of the semiconductor substrate 41 for each of the pixels 21. The on-chip lens 71 may be configured by an organic material, or may be configured by an inorganic material. Examples of the organic material include a siloxane-based resin, a styrene-based resin, and an acrylic-based resin. Examples of the inorganic material include silicon nitride (SiN) and silicon oxynitride (SiON).

A front surface of the on-chip lens 71 is preferably covered with an antireflection film (an antireflection film 72). This makes it possible to suppress reflection of light by the front surface of the on-chip lens 71. A material similar to that of the above-described antireflection film 64 may be used for the antireflection film 72.

In the present embodiment, the reflective member 73 is provided at a position opposed to the APD 31 with the on-chip lens 71 and the antireflection film 72 interposed therebetween. The reflective member 73 is reflective to light of a wavelength in a near infrared region and an infrared region, and reflects light reflected by the wiring line 104 of the wiring layer 42 back toward the APD 31. This prevents the light reflected by the wiring line 104 from exiting to the outside of the APD 31, i.e., to the outside from the first surface S1 of the semiconductor substrate 41, although description thereof is given later in more detail. The reflective member 73 corresponds to a specific example of the first reflective member of the present disclosure.

The reflective member 73 is provided in a film shape, for example, on each on-chip lens 71 to cover a portion of the on-chip lens 71. For example, the reflective member 73 is disposed at a middle part of the on-chip lens 71. For example, a film configured by tungsten (W), silver (Ag), aluminum (Al), gold (Au), copper (Cu), etc. may be used for the reflective member 73.

FIGS. 4A, 4B, and 4C each illustrate an example of a planar shape of the reflective member 73. The reflective member 73 has a planar shape such as a quadrangle (FIG. 4A), a circle (FIG. 4B), or a hexagon (FIG. 4C), for example. The reflective member 73 may have any planar shape; for example, the planar shape of the reflective member 73 may be a polygon other than the hexagon, or an ellipse, etc. An area occupied by the reflective member 73 in a plan view is preferably 25% or less of an area of the pixel 21. Hereinafter, description is given of a size of the reflective member 73.

FIG. 5 illustrates a relationship between the size of the reflective member 73 (an area of the reflective member 73 in a plan view) and quantum efficiency by way of results obtained by simulation. It is appreciated, from the results, that the quantum efficiency of the APD 31 is increased by about 1% to about 2% when providing the reflective member 73 having a sufficiently small area relative to the area of the pixel 21, as compared with a case of not providing the reflective member 73. Meanwhile, the quantum efficiency of the APD 31 is greatly decreased when the area of the reflective member 73 exceeds X. The X is a value at which the area of the reflective member 73 accounts for 25% of the area of the pixel 21. For example, in the pixel 21 of a square shape having a size with a side length of 10 μm, it is preferable to provide the reflective member 73 having an area equal to or less than 25 μm$^2$. More preferably, an area occupied by the reflective member 73 is between 1% and 4% of the area of the pixel 21. The reflective member 73 has a thickness of 300 nm, for example.

[Operation of Sensor Chip 11]

In the sensor chip 11, light (light of a wavelength in a near infrared region and an infrared region) condensed by the on-chip lens 71 for each pixel 21 enters the APD 31. This allows for generation of pairs of holes (holes) and electrons (photoelectrically converted) in the APD 31. For example, when the negative voltage $V_{BD}$ is supplied from the wiring layer 43 to the N-type diffusion layer 53 via the metal pads 101 and 102, the contact electrode 103, and the wiring line 104, the avalanche multiplication region 57 is formed in the APD 31. This allows, for example, electrons to be avalanche-multiplied and a light-receiving signal to be generated. In addition, the P-type region 56 is supplied with a predetermined voltage from the wiring layer 43 via the metal pads 101 and 102, the contact electrode 103, and the wiring line 105.

[Workings and Effects of Sensor Chip 11]

The sensor chip 11 of the present embodiment includes the reflective member 73 that reflects light reflected by the wiring line 104. This makes it easier for the light reflected by the wiring line 104 to enter the APD 31 efficiently. Hereinafter, description is given of the workings and effects, referring to a comparative example.

FIG. 6 illustrates a schematic cross-sectional configuration of a main part of a sensor chip (a sensor chip 111)

according to the comparative example. FIG. 6 corresponds to FIG. 2 illustrating the sensor chip 11. Similarly to the sensor chip 11, the sensor chip 111 has a stacked structure of the semiconductor substrate 41, the wiring layer 42, and the wiring layer 43, with the wiring line 104 being provided in the wiring layer 42. The on-chip lens 71 is provided for each of the pixels 21 over the first surface S1 of the semiconductor substrate 41. The sensor chip 111 is not provided with a reflective member (the reflective member 73 in FIG. 2) on the on-chip lens 71. The sensor chip 111 is different from the sensor chip 11 in this point.

In such a sensor chip 111, a portion of light (e.g., light $L_{IR}$ of a wavelength in a near infrared region and an infrared region) condensed by the on-chip lens 71 for each pixel 21 passes through the semiconductor substrate 41 to enter the wiring layer 42. The light $L_{IR}$ having entered the wiring layer 42 is reflected by the wiring line 104 to propagate back toward the semiconductor substrate 41 (FIG. 6). In this manner, providing the wiring line 104 makes it easier for a portion of the light $L_{IR}$ transmitted through the semiconductor substrate 41 to reenter the semiconductor substrate 41. This makes it possible to improve sensitivity as compared with a case where the wiring line 104 is not provided.

However, although a portion of the light $L_{IR}$ reflected by the wiring line 104 is photoelectrically converted by the APD 31, remaining light $L_{IR}$ exits to the outside of the semiconductor substrate 41 from the first surface S1 of the semiconductor substrate 41. For example, about 45% of the light $L_{IR}$ reflected by the wiring line 104 results in going through to the outside of the semiconductor substrate 41. In this manner, when the light $L_{IR}$ reflected by the wiring line 104 exits to the outside of the semiconductor substrate 41, it is difficult to sufficiently improve the sensitivity. In addition, flare may possibly occur due to the light $L_{IR}$ having exited to the outside of the semiconductor substrate 41.

In contrast, the sensor chip 11 includes the reflective member 73 opposed to the APD 31 with the on-chip lens 71 interposed therebetween, thus enabling the light reflected by the wiring line 104 to enter the APD 31 more efficiently.

FIG. 7 illustrates an example of a path of the light $L_{IR}$ in the sensor chip 11. In the sensor chip 11, light $L_{IR}$, of the light $L_{IR}$ reflected by the wiring line 104, not having been photoelectrically converted by the APD 31 is reflected again by the reflective member 73. The light reflected by the reflective member 73 propagates toward the APD 31 to be photoelectrically converted by the APD 31. Alternatively, the light reflected by the reflective member 73 enters the wiring layer 42 from the semiconductor substrate 41 to be reflected by the wiring line 104.

FIG. 8 illustrates a relationship between a depth of a semiconductor substrate (e.g., the semiconductor substrate 41) and an absorbed amount of light of each of wavelengths (540 nm, 550 nm, 560 nm, 850 nm, 900 nm, and 940 nm). Substantially 100% of light of each of wavelengths (540 nm, 550 nm, and 560 nm in a visible region) is absorbed at a shallow position of the semiconductor substrate. Meanwhile, light of each of wavelengths (850 nm, 900 nm, and 940 nm) in an infrared region is lower in terms of the amount of absorption into the semiconductor substrate than the light of a wavelength in a visible region, and the amount of absorption into the semiconductor substrate increases as an optical path length (depth of the semiconductor substrate) is increased. That is, in the light of the wavelength in the near infrared region and the infrared region, increasing the optical path length makes it possible to effectively improve the sensitivity.

In this manner, providing the sensor chip 11 with the wiring line 104 on the side of the second surface S2 of the semiconductor substrate 41 and with the reflective member 73 on the side of the first surface S1 enables the light $L_{IR}$ to repeat the reflection between the wiring line 104 and the reflective member 73. This makes it easier for the light $L_{IR}$ reflected by the wiring line 104 to enter the APD 31 efficiently, thus making it possible to improve the sensitivity as compared with the sensor chip 111. In addition, there is less light exiting to the outside of the semiconductor substrate 41 from the first surface S1 of the semiconductor substrate 41, thus making it possible to suppress the occurrence of flare.

As described above, the sensor chip 11 of the present embodiment includes the reflective member 73 that reflects the light $L_{IR}$ reflected by the wiring line 104, thus making it possible to prevent the light $L_{IR}$ reflected by the wiring line 104 from exiting to the outside of the APD 31. This makes it possible to improve the sensitivity. In addition, it is possible to suppress the occurrence of flare.

Hereinafter, description is given of modification examples of the foregoing embodiment; in the following description, the same components as those of the foregoing embodiment are denoted by the same reference numerals, and description thereof is omitted as appropriate.

MODIFICATION EXAMPLE 1

FIG. 9 illustrates a schematic cross-sectional configuration of a main part of a sensor chip (a sensor chip 11A) according to Modification Example 1 of the foregoing embodiment. FIG. 9 illustrates a cross-sectional configuration of one pixel 21. The sensor chip 11A includes an antireflection film 74 on the reflective member 73. Here, the antireflection film 74 corresponds to a specific example of an antireflection member of the present disclosure. Except for this point, the sensor chip 11A according to Modification Example 1 has configurations similar to those of the sensor chip 11 of the foregoing embodiment, and workings and effects thereof are also similar. FIG. 9 illustrates a configuration of the APD 31 in a simplified manner. Similarly, also in the cross-sectional view described in Modification Example 2 and thereafter, illustration of the APD 31 is simplified.

The antireflection film 74 is stacked on the reflective member 73 on side opposite to the on-chip lens 71. The antireflection film 74 is provided, for example, at a position overlapping the reflective member 73 in a plan view, and has the same planar shape as that of the reflective member 73. For example, in a plan view, an end face of the antireflection film 74 and an end face of the reflective member 73 are provided at the same position. The antireflection film 74 is provided for each on-chip lens 71 (for each pixel 21). It is to be noted that, in FIG. 9 and thereafter, the insulating film 62 (pixel separation part 63) has an inverted tapered shape, but the shape of the insulating film 62 may be another shape, and may be a tapered shape, for example.

The antireflection film 74 is configured by a material that prevents reflection of light of a wavelength in a near infrared region and an infrared region. For example, a carbon black film, a silicon oxide (SiO) film, or the like may be used for the antireflection film 74. The antireflection film 74 may be configured by a stacked film of a carbon black film and a silicon oxide film.

In the present modification example as well, the reflective member 73 is provided similarly to the foregoing embodiment, thus making it easier for the light $L_{IR}$ reflected by the wiring line 104 to enter the APD 31 efficiently. In addition, the reflective member 73 is covered with the antireflection film 74, thus suppressing reflection of light by a front surface of the reflective member 73 (a surface on side opposite to the on-chip lens 71). This makes it possible to suppress the occurrence of flare more effectively.

MODIFICATION EXAMPLE 2

FIG. 10A illustrates a schematic configuration of each main part of a sensor chip (a sensor chip 11B) according to Modification Example 2 of the foregoing embodiment. In the sensor chip 11B, the position of the reflective member 73 on the on-chip lens 71 differs depending on positions of the pixels 21 in the pixel array section 12 (FIG. 1). Except for this point, the sensor chip 11B according to Modification Example 2 has configurations similar to those of the sensor chip 11 of the foregoing embodiment, and workings and effects thereof are also similar.

FIG. 10B illustrates an example of positions of the pixels 21 illustrated in FIG. 10A. For example, in the pixel 21C arranged at the middle part of the pixel array section 12, the reflective member 73 is provided at a position overlapping a center line CL of the on-chip lens 71. Meanwhile, in the pixel 21 (e.g., pixels 21R and 21L described later) arranged outside the pixel 21C at the middle part, of the pixel array section 12, the reflective member 73 is provided at a position deviated from the center line CL of the on-chip lens 71. For example, in the pixel 21R arranged on right end side of the same row as the pixel 21C at the middle part on the sheet, the reflective member 73 is provided on right side of the center line CL of the on-chip lens 71. The position of the reflective member 73 may be gradually shifted, as being closer to the pixel 21R at the right end from the pixel 21C at the middle part of the pixel array section 12. For example, in the pixel 21L arranged on left end side of the same row as the pixel 21C at the middle part on the sheet, the reflective member 73 is provided on left side of the center line CL of the on-chip lens 71. The position of the reflective member 73 may be gradually shifted, as being closer to the pixel 21L at the left end from the pixel 21C at the middle part of the pixel array section 12. For example, the position of the reflective member 73 with respect to the on-chip lens 71 differs among the pixels 21, depending on image heights in the pixel array section 12.

FIG. 11 illustrates a configuration of the sensor chip 11B including the antireflection film 74 described in the foregoing Modification Example 1. In this manner, the antireflection film 74 may be stacked on the reflective member 73 of the sensor chip 11B.

In the present modification example as well, the reflective member 73 is provided similarly to the foregoing embodiment, thus making it easier for the light $L_{IR}$ reflected by the wiring line 104 to enter the APD 31 efficiently. In addition, the position of the reflective member 73 with respect to the on-chip lens 71 differs among the pixels 21 depending on the image heights of the pixel array section 12, thus allowing light entering the on-chip lens 71 in an oblique direction to enter the APD 31 efficiently. That is, it is possible to improve sensitivity of the 11B because of effects similar to those of pupil correction.

MODIFICATION EXAMPLE 3

FIGS. 12A and 12B each illustrate a schematic configuration of a main part of a sensor chip (a sensor chip 11C) according to Modification Example 3 of the foregoing embodiment. FIG. 12A illustrates an example of a cross-sectional configuration of the sensor chip 11C, and FIG. 12B illustrates an example of a planar configuration of the sensor chip 11C. In the sensor chip 11C, the reflective member 73 is provided to be separated into a plurality of portions (a main portion 73m and a small portion 73s). Except for this point, the sensor chip 11C according to Modification Example 3 has configurations similar to those of the sensor chip 11 of the foregoing embodiment, and workings and effects thereof are also similar.

Each pixel 21 is provided with the reflective member 73 that includes the main portion 73m and the small portion 73s separated from each other. The main portion 73m has, for example, a quadrangular planar shape, and is arranged at the middle part of the on-chip lens 71. For example, a plurality of small portions 73s are provided in each pixel 21. Each of the small portions 73s has, for example, a quadrangular planar shape, and has an area smaller than an area of the main portion 73m in a plan view. In each pixel 21, the plurality of small portions 73s are arranged to surround a periphery of one main portion 73m. In each pixel 21, the reflective member 73 separated into the plurality of portions may be provided in a fence-like manner.

In the present modification example as well, the reflective member 73 is provided similarly to the foregoing embodiment, thus making it easier for the light $L_{IR}$ reflected by the wiring line 104 to enter the APD 31 efficiently. In addition, providing the reflective member 73 separated into the plurality of portions in each pixel 21 makes it easier for the light $L_{IR}$ having entered the on-chip lens 71 to be efficiently confined in each pixel 21. Further, loss of the light $L_{IR}$ entering the on-chip lens 71 is suppressed.

MODIFICATION EXAMPLE 4

FIG. 13 illustrates a schematic cross-sectional configuration of a main part of a sensor chip (a sensor chip 11D) according to Modification Example 4 of the foregoing embodiment. The sensor chip 11D has an inverted pyramid array structure (an inverted pyramid array structure 41P) on the first surface S1 of the semiconductor substrate 41. Except for this point, the sensor chip 11D according to Modification Example 4 has configurations similar to those of the sensor chip 11 of the foregoing embodiment, and workings and effects thereof are also similar.

The inverted pyramid array structure 41P is provided on substantially the entire surface of each pixel 21. The inverted pyramid array structure 41P is a so-called IPA (Inverted Pyramid Array) structure, and is a minute uneven structure of a pyramid form (quadrangular pyramid form) provided on the first surface S1 of the semiconductor substrate 41.

In the present modification example as well, the reflective member 73 is provided similarly to the foregoing embodiment, thus making it easier for the light $L_{IR}$ reflected by the wiring line 104 to enter the APD 31 efficiently. In addition, the inverted pyramid array structure 41P is provided on the first surface S1 of the semiconductor substrate 41, thus making it possible to further enhance sensitivity of the APD 31 by means of optical diffraction.

MODIFICATION EXAMPLE 5

FIG. 14 illustrates a schematic cross-sectional configuration of a main part of a sensor chip (a sensor chip 11E) according to Modification Example 5 of the foregoing embodiment. In the sensor chip 11E, the pixel array section 12 (FIG. 1) includes, together with the pixel 21 including the APD 31, a pixel 21V including a PD (Photo Diode) 31V that receives light of a wavelength in a visible region. Except for this point, the sensor chip 11E according to Modification Example 5 has configurations similar to those of the sensor chip 11 of the foregoing embodiment, and workings and effects thereof are also similar. Here, the pixel 21V corresponds to a specific example of a second pixel of the present technology, and the PD 31V corresponds to a specific example of a photodiode of the present technology.

The Pixel 21V is a pixel that receives light beams in a red wavelength region, a green wavelength region, and a blue wavelength region to generate a light-receiving signal, and includes a color filter 75 between the first surface S1 of the semiconductor substrate 41 and the on-chip lens 71. The color filter 75 selectively transmits light in a wavelength region of any of the red wavelength region, the green wavelength region, and the blue wavelength region. The PD 31V provided in the pixel 21V may not be provided with an avalanche multiplication region (the avalanche multiplication region 57 in FIG. 2). Alternatively, an APD that receives light of a wavelength in a visible region may be used for the pixel 21V.

The reflective member 73 is selectively provided, for example, in the pixel 21 that receives light of a wavelength in a near infrared region and an infrared region, among the pixels 21 and 21V. This makes it possible, for the pixel 21V that receives the light of a wavelength in a visible region, to suppress loss of light caused by the reflective member 73.

FIG. 15 illustrates another example of the sensor chip 11E. In the sensor chip 11E, the pixels 21 and 21V are each provided with a stacked structure of the reflective member 73 and an optical functional film 76. The stacked structure of the reflective member 73 and the optical functional film 76 has properties of reflecting light of a wavelength in a near infrared region and an infrared region and of transmitting light of a wavelength in a visible region. Providing such a stacked structure of the reflective member 73 and the optical functional film 76 allows the reflective member 73 to function only in the pixel 21, among the pixels 21 and 21V. Providing the reflective member 73 and the optical functional film 76 in the pixels 21 and 21V in the sensor chip 11E eliminates necessity of separate creation of the pixel 21 and the pixel 21V, thus making it possible to reduce manufacturing costs. The optical functional film 76 may be configured by, for example, a stacked film, or the like in which a high refractive index material film and a low refractive index material film are alternately stacked. For example, a silicon oxide ($SiO_2$) film may be used as the low refractive material film, and a titanium oxide ($TiO_2$) film may be used as the high refractive index material film. Using such an optical functional film 76 makes it possible to transmit light of a wavelength in a visible region without transmitting light of a wavelength in a near infrared region and an infrared region.

In the present modification example as well, the reflective member 73 is provided similarly to the foregoing embodiment, thus making it easier for the light $L_{IR}$ reflected by the wiring line 104 to enter the APD 31 efficiently. In addition, providing the pixel 21V that receives the light of a wavelength in a visible region, together with the pixel 21 that receives the light of a wavelength in a near infrared region and an infrared region makes it possible to increase acquired information.

APPLICATION EXAMPLE

FIG. 16 is a block diagram illustrating a configuration example of the distance measurement apparatus 200 which is an electronic apparatus utilizing any of the sensor chips 11, 11A, 11B, 11C, 11D, and 11E.

As illustrated in FIG. 16, the distance measurement apparatus 200 includes a distance measurement image sensor 201 and a light source device 211. The distance measurement image sensor 201 includes an optical system 202, a sensor chip 203, an image processing circuit 204, a monitor 205, and a memory 206. Further, light projected toward a subject from the light source device 211 is reflected by a front surface of the subject, and the distance measurement image sensor 201 receives the reflected light (modulated light or pulsed light) to thereby be able to acquire a distance image corresponding to a distance to the subject.

The optical system 202 is configured by one or a plurality of lenses, and guides image light (incident light) from the subject to the sensor chip 203 to form an image on a light-receiving surface (sensor unit) of the sensor chip 203.

The sensor chip 11, 11A, 11B, 11C, 11D, or 11E described above is applied to the sensor chip 203, and a distance signal indicating a distance determined from a light-receiving signal (APD OUT) outputted from the sensor chip 203 is supplied to the image processing circuit 204.

The image processing circuit 204 performs image processing for constructing the distance image on the basis of the distance signal supplied from the sensor chip 203, and the distance image (image data) obtained by the image processing is supplied to the monitor 205 to be displayed or supplied to the memory 206 to be stored (recorded).

In the distance measurement image sensor 201 thus configured, applying the sensor chip 11, 11A, 11B, 11C, 11D, or 11E described above makes it possible to acquire a more accurate distance image, for example, in association with the improvement in the sensitivity in the pixel 21.

<Usage Example of Image Sensor>

FIG. 17 illustrates a usage example where the above-described image sensor (distance measurement image sensor 201) is used.

The above-described image sensor may be used in various cases for sensing of light such as visible light, infrared light, ultraviolet light, and X-rays, for example, as described below.

An apparatus that captures an image to be used for appreciation, such as a digital camera and a mobile device equipped with a camera function An apparatus to be used for traffic for safety driving including an automatic stop and for recognition, etc. of the state of a driver, such as a vehicle-mounted sensor that captures images of a front, a rear, a surrounding, an inside, and the like of an automobile, a monitor camera that monitors traveling vehicles and a road, and a distance measurement sensor that measures a distance between vehicles, etc.

An apparatus to be used for household appliances such as a TV, a refrigerator, and an air conditioner, in order to capture an image of a user's gesture and to perform an equipment operation in accordance with the gesture An apparatus to be used for a medical treatment and a health care, such as an endoscope, and an apparatus that captures an image of a blood vessel by means of light reception of infrared light An apparatus to be used for security, such as a monitoring camera for an application of crime prevention and a camera for a person authentication application An apparatus to be used for beauty care, such as a skin measuring instrument that captures an image of a skin and a microscope that captures an image of a scalp An apparatus to be used for sports, such as an action camera and a wearable camera for a sports application, etc.

An apparatus to be used for agriculture, such as a camera for monitoring states of fields and crops Further, the image sensor described in the foregoing embodiment, etc. is also applicable to electronic apparatuses described below.

<Example of Practical Application to In-Vivo Information Acquisition System>

Further, the technology according to an embodiment of the present disclosure (present technology) is applicable to various products. For example, the technology according to an embodiment of the present disclosure may be applied to an endoscopic surgery system.

FIG. 18 is a block diagram depicting an example of a schematic configuration of an in-vivo information acquisition system of a patient using a capsule type endoscope, to which the technology according to an embodiment of the present disclosure (present technology) can be applied.

The in-vivo information acquisition system 10001 includes the capsule type endoscope 10100 and an external controlling apparatus 10200.

The capsule type endoscope 10100 is swallowed by a patient at the time of inspection. The capsule type endoscope 10100 has an image pickup function and a wireless communication function and successively picks up an image of the inside of an organ such as the stomach or an intestine (hereinafter referred to as in-vivo image) at predetermined intervals while it moves inside of the organ by peristaltic motion for a period of time until it is naturally discharged from the patient. Then, the capsule type endoscope 10100 successively transmits information of the in-vivo image to the external controlling apparatus 10200 outside the body by wireless transmission.

The external controlling apparatus 10200 integrally controls operation of the in-vivo information acquisition system 10001. Further, the external controlling apparatus 10200 receives information of an in-vivo image transmitted thereto from the capsule type endoscope 10100 and generates image data for displaying the in-vivo image on a display apparatus (not depicted) on the basis of the received information of the in-vivo image.

In the in-vivo information acquisition system 10001, an in-vivo image imaged a state of the inside of the body of a patient can be acquired at any time in this manner for a period of time until the capsule type endoscope 10100 is discharged after it is swallowed.

A configuration and functions of the capsule type endoscope 10100 and the external controlling apparatus 10200 are described in more detail below.

The capsule type endoscope 10100 includes a housing 10101 of the capsule type, in which a light source unit 10111, an image pickup unit 10112, an image processing unit 10113, a wireless communication unit 10114, a power feeding unit 10115, a power supply unit 10116 and a control unit 10117 are accommodated.

The light source unit 10111 includes a light source such as, for example, a light emitting diode (LED) and irradiates light on an image pickup field-of-view of the image pickup unit 10112.

The image pickup unit 10112 includes an image pickup element and an optical system including a plurality of lenses provided at a preceding stage to the image pickup element. Reflected light (hereinafter referred to as observation light) of light irradiated on a body tissue which is an observation target is condensed by the optical system and introduced into the image pickup element. In the image pickup unit 10112, the incident observation light is photoelectrically converted by the image pickup element, by which an image signal corresponding to the observation light is generated. The image signal generated by the image pickup unit 10112 is provided to the image processing unit 10113.

The image processing unit 10113 includes a processor such as a central processing unit (CPU) or a graphics processing unit (GPU) and performs various signal processes for an image signal generated by the image pickup unit 10112. The image processing unit 10113 provides the image signal for which the signal processes have been performed thereby as RAW data to the wireless communication unit 10114.

The wireless communication unit 10114 performs a predetermined process such as a modulation process for the image signal for which the signal processes have been performed by the image processing unit 10113 and transmits the resulting image signal to the external controlling apparatus 10200 through an antenna 10114A. Further, the wireless communication unit 10114 receives a control signal relating to driving control of the capsule type endoscope 10100 from the external controlling apparatus 10200 through the antenna 10114A. The wireless communication unit 10114 provides the control signal received from the external controlling apparatus 10200 to the control unit 10117.

The power feeding unit 10115 includes an antenna coil for power reception, a power regeneration circuit for regenerating electric power from current generated in the antenna coil, a voltage booster circuit and so forth. The power feeding unit 10115 generates electric power using the principle of non-contact charging.

The power supply unit 10116 includes a secondary battery and stores electric power generated by the power feeding unit 10115. In FIG. 18, in order to avoid complicated illustration, an arrow mark indicative of a supply destination of electric power from the power supply unit 10116 and so forth are omitted. However, electric power stored in the power supply unit 10116 is supplied to and can be used to drive the light source unit 10111, the image pickup unit 10112, the image processing unit 10113, the wireless communication unit 10114 and the control unit 10117.

The control unit 10117 includes a processor such as a CPU and suitably controls driving of the light source unit 10111, the image pickup unit 10112, the image processing unit 10113, the wireless communication unit 10114 and the power feeding unit 10115 in accordance with a control signal transmitted thereto from the external controlling apparatus 10200.

The external controlling apparatus 10200 includes a processor such as a CPU or a GPU, a microcomputer, a control board or the like in which a processor and a storage element such as a memory are mixedly incorporated. The external controlling apparatus 10200 transmits a control signal to the control unit 10117 of the capsule type endoscope 10100 through an antenna 10200A to control operation of the capsule type endoscope 10100. In the capsule type endoscope 10100, an irradiation condition of light upon an observation target of the light source unit 10111 can be changed, for example, in accordance with a control signal from the external controlling apparatus 10200. Further, an image pickup condition (for example, a frame rate, an exposure value or the like of the image pickup unit 10112) can be changed in accordance with a control signal from the external controlling apparatus 10200. Further, the substance of processing by the image processing unit 10113 or a condition for transmitting an image signal from the wireless communication unit 10114 (for example, a transmission interval, a transmission image number or the like) may be changed in accordance with a control signal from the external controlling apparatus 10200.

Further, the external controlling apparatus 10200 performs various image processes for an image signal transmitted thereto from the capsule type endoscope 10100 to generate image data for displaying a picked up in-vivo image on the display apparatus. As the image processes, various signal processes can be performed such as, for example, a development process (demosaic process), an image quality improving process (bandwidth enhancement process, a super-resolution process, a noise reduction (NR) process and/or image stabilization process) and/or an enlargement process (electronic zooming process). The external controlling apparatus 10200 controls driving of the display apparatus to cause the display apparatus to display a picked up in-vivo image on the basis of generated image data. Alternatively, the external controlling apparatus 10200 may also control a recording apparatus (not depicted) to record generated image data or control a printing apparatus (not depicted) to output generated image data by printing.

The description has been given above of one example of the in-vivo information acquisition system, to which the technology according to an embodiment of the present disclosure is applicable. The technology according to an embodiment of the present disclosure is applicable to, for example, the image pickup unit 10112 of the configurations described above. This makes it possible to improve detection accuracy.

<Example of Practical Application to Endoscopic Surgery System>

The technology according to an embodiment of the present disclosure (present technology) is applicable to various products. For example, the technology according to an embodiment of the present disclosure may be applied to an endoscopic surgery system.

FIG. 19 is a view depicting an example of a schematic configuration of an endoscopic surgery system to which the technology according to an embodiment of the present disclosure (present technology) can be applied.

In FIG. 19, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

FIG. 20 is a block diagram depicting an example of a functional configuration of the camera head 11102 and the CCU 11201 depicted in FIG. 19.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

The description has been given above of one example of the endoscopic surgery system, to which the technology according to an embodiment of the present disclosure is applicable. The technology according to an embodiment of the present disclosure is applicable to, for example, the image pickup unit 11402 of the configurations described above. Applying the technology according to an embodiment of the present disclosure to the image pickup unit 11402 makes it possible to improve detection accuracy.

It is to be noted that although the endoscopic surgery system has been described as an example here, the technology according to an embodiment of the present disclosure may also be applied to, for example, a microscopic surgery system, and the like.

<Example of Practical Application to Mobile Body>

The technology according to an embodiment of the present disclosure (present technology) is applicable to various products. For example, the technology according to an embodiment of the present disclosure may be achieved in the form of an apparatus to be mounted to a mobile body of any kind. Non-limiting examples of the mobile body may include an automobile, an electric vehicle, a hybrid electric vehicle, a motorcycle, a bicycle, any personal mobility device, an airplane, an unmanned aerial vehicle (drone), a vessel, a robot, a construction machine, and an agricultural machine (tractor).

FIG. 21 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 21, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 21, an audio speaker 12061, a display section 12062, and an instrument panel 12063 are illustrated as the output device. The display section 12062 may, for example, include at least one of an on-board display and a head-up display.

FIG. 22 is a diagram depicting an example of the installation position of the imaging section 12031.

In FIG. 22, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 22 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

The description has been given hereinabove of an example of the vehicle control system to which the technology according to an embodiment of the present disclosure may be applied. The technology according to an embodiment of the present disclosure may be applied to the imaging section 12031 out of the configurations described above. Applying the technology according to an embodiment of the present disclosure to the imaging section 12031 makes it possible to obtain a captured image that is easier to see. This makes it possible to decrease fatigue of a driver.

Although the description has been given by referring to the embodiment and the modification examples, the contents of the present disclosure are not limited to the foregoing embodiment, etc., and may be modified in a variety of ways. For example, the sensor chip configuration described in the foregoing embodiment, etc. is exemplary, and may further include any other layer. In addition, the materials and thicknesses of the respective layers are also exemplary and are not limited to those described above.

For example, although the description has been given, in the foregoing embodiment, etc., of the case where the reflective member 73 is provided on the on-chip lens 71, the reflective member 73 may be provided on the side of the first surface S1 of the semiconductor substrate 41. For example, as illustrated in FIG. 23, the on-chip lens 71 may be provided to cover the reflective member 73 provided on the first surface S1 of the semiconductor substrate 41.

In addition, although the description has been given, in the foregoing embodiment, etc., of the case where the on-chip lens 71 is used as a light-condensing structure, a digital lens (a digital lens 71D) may be used instead of the on-chip lens 71, as illustrated in FIG. 24. The digital lens 71D condenses light on the APD 31 by means of diffraction of incident light. At this time, the reflective member 73 is disposed on the first surface S1 of the semiconductor substrate 41, for example, together with the digital lens 71D.

In addition, although FIG. 2, etc. specifically illustrates an example of the configuration of the APD 31, the configuration of the APD 31 may further include another component, or may not include all of the components. In addition, the arrangement of the components configuring the APD 31 may be another arrangement.

In addition, although the description has been given, in the foregoing embodiment, etc., of the case where the wiring line 104 functions as a cathode of the APD 31 and the wiring line 105 functions as an anode of the APD 31, the wiring line 104 may function as the anode and the wiring line 105 may function as the cathode. The electric conductivity types (P-type and N-type) described in the foregoing embodiment may have mutually opposite configurations.

In addition, although the description has been given, in the foregoing embodiment, etc., of the case where a specific example of the first reflective member of the present technology is the wiring line 104 of the wiring layer 42, the first reflective member may be configured by a reflective member other than the wiring line 104. Alternatively, another reflective member, in addition to the wiring line 104, may be provided in the wiring layer 42 or the wiring layer 43.

It is to be noted that the effects described in the foregoing embodiment, etc. are merely exemplary, and may be other effects or may further include other effects.

It is to be noted that the present disclosure may have the following configurations. According to the sensor chip and the distance measurement apparatus having the following configurations, a second reflective member is provided that reflects light reflected by a first reflective member, thus making it possible to prevent light reflected by the first reflective member from exiting to the outside of an avalanche photodiode. Thus, it is possible to improve sensitivity.

(1)

A sensor including:

a semiconductor substrate having a first surface and a second surface opposed to each other, the semiconductor substrate including an avalanche photodiode;

an on-chip lens provided on side of the first surface of the semiconductor substrate;

a first reflective member provided on the on-chip lens; and a wiring layer provided on side of the second surface of the semiconductor substrate, and including a second reflective member.

(2)

The sensor according to (1), in which light reflected by the second reflective member is further reflected by the first reflective member.

(3)

The sensor according to (1) or (2), in which the avalanche photodiode receives light of a wavelength in a near infrared region and an infrared region.

(4)

The sensor according to any one of (1) to (3), in which the on-chip lens comprises a plurality of on-chip lenses.

(5)

The sensor according to (4), in which the first reflective member is provided on each of the plurality of on-chip lenses.

(6)

The sensor according to (5), in which the first reflective member is disposed at a position deviated from a middle part on the on-chip lens.

(7)

The sensor according to (6), in which the first reflective member is disposed at the middle part on the on-chip lens.

(8)

The sensor according to any one of (1) to (7), further including an antireflection member stacked on the first reflective member on side opposite to the on-chip lens.

(9)

The sensor according to (8), in which the antireflection member includes a carbon black film or a silicon oxide film.

(10)

The sensor according to any one of (1) to (9), in which the avalanche photodiode and the on-chip lens are provided for each of pixels, and the pixels each have a different position of the first reflective member with respect to the on-chip lens.

(11)

The sensor according to (10), further including a pixel array section in which a plurality of the pixels are provided, in which the first reflective member is provided at the middle part of the on-chip lens in the pixel at a middle part of the pixel array section, and the pixel array section outside the middle part of the pixel array section includes the pixels in each of which the first reflective member is provided at the position deviated from the middle part of the on-chip lens.

(12)

The sensor according to any one of (1) to (11), in which an inverted pyramid array structure is provided on a front surface of the semiconductor substrate.

(13)
The sensor according to any one of (1) to (12), in which the avalanche photodiode and the on-chip lens are provided for each of the pixels, and
an area occupied by the first reflective member is 25% or less of an area of each of the pixels.
(14)
The sensor according to any one of (1) to (13), in which the first reflective member includes tungsten, silver, aluminum, gold, or copper.
(15)
The sensor according to any one of (1) to (14), in which the on-chip lens is provided for each of the pixels,
the plurality of the pixels include a first pixel and a second pixel,
the first pixel includes the avalanche photodiode that receives the light of the wavelength in the near infrared region and the infrared region, and
the second pixel includes a photodiode that receives light of a wavelength in a visible region.
(16)
The sensor according to (15), in which the first reflective member is selectively provided in the first pixel, among the first pixel and the second pixel.
(17)
The sensor according to (15), further including an optical functional film stacked on the first reflective member, in which
the optical functional film and the first reflective member are provided in each of the first pixel and the second pixel, and
the optical functional film and the first reflective member transmit the light of the wavelength in the visible region and reflect the light of the wavelength in the near infrared region and the infrared region.
(18)
The sensor according to any one of (1) to (17), in which the first reflective member is provided to be separated into a plurality of portions.
(19)
A distance measurement apparatus including a sensor, the sensor including
a semiconductor substrate having a first surface and a second surface opposed to each other, the semiconductor substrate including an avalanche photodiode,
an on-chip lens provided on side of the first surface of the semiconductor substrate,
a first reflective member provided on the on-chip lens, and
a wiring layer provided on side of the second surface of the semiconductor substrate, and including a second reflective member.

This application claims the benefit of Japanese Priority Patent Application JP2019-040812 filed with the Japan Patent Office on Mar. 6, 2019, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:
1. A sensor chip, comprising:
a pixel array section comprising a plurality of pixels, wherein
the plurality of pixels includes:
a first set of pixels, and
a second set of pixels different from the first set of pixels, wherein the second set of pixels is outside a middle part of the pixel array section;
each pixel of the plurality of pixels includes:
a semiconductor substrate that includes:
a first surface;
a second surface, wherein the first surface is opposite to the second surface; and
an avalanche photodiode;
an on-chip lens on a side of the first surface of the semiconductor substrate;
a first reflective member that is on a front surface of the on-chip lens at a position which is opposite to the avalanche photodiode, wherein the position of the first reflective member on the on-chip lens is based on an image height of one of the first set of pixels or the second set of pixels in the pixel array section, wherein the first reflective member includes a main portion and a small portion separated from each other; and
a wiring layer on a side of the second surface of the semiconductor substrate, wherein the wiring layer includes a second reflective member.
2. The sensor chip according to claim 1, wherein the second reflective member is configured to reflect a light towards the first reflective member, and the first reflective member is configured to reflect the reflected light towards the avalanche photodiode.
3. The sensor chip according to claim 1, wherein the avalanche photodiode is configured to receive a light of a wavelength in a near infrared region and an infrared region.
4. The sensor chip according to claim 1, wherein the first reflective member is on the on-chip lens.
5. The sensor chip according to claim 1, wherein the position of the first reflective member deviates from a middle part of the on-chip lens.
6. The sensor chip according to claim 1, wherein the first reflective member is at a middle part of the on-chip lens.
7. The sensor chip according to claim 1, further comprising an antireflection member stacked on the first reflective member on a side of the first reflective member, wherein the side of the first reflective member is opposite to the on-chip lens.
8. The sensor chip according to claim 7, wherein the antireflection member includes one of a carbon black film or a silicon oxide film.
9. The sensor chip according to claim 1, wherein
the first reflective member is at a middle part of the on-chip lens for the first set of pixels, and
the first reflective member deviates from the middle part of the on-chip lens for the second set of pixels.
10. The sensor chip according to claim 1, wherein an inverted pyramid array structure is on a front surface of the semiconductor substrate.
11. The sensor chip according to claim 1, wherein
the first reflective member occupies a specific area that is 25% or less of an area of each pixel of the plurality of pixels.
12. The sensor chip according to claim 1, wherein the first reflective member includes one of tungsten, silver, aluminum, gold, or copper.
13. The sensor chip according to claim 1, wherein
the plurality of pixels includes a first pixel and a second pixel,
the first pixel includes the avalanche photodiode configured to receive a light of a wavelength in a near infrared region and an infrared region, and the second pixel includes a photodiode configured to receive a light of a wavelength in a visible region.

14. The sensor chip according to claim 13, wherein the first pixel includes the first reflective member.

15. The sensor chip according to claim 13, further comprising an optical functional film stacked on the first reflective member, wherein
each of the optical functional film and the first reflective member are in the first pixel and the second pixel, and
the optical functional film and the first reflective member are configured to transmit the light of the wavelength in the visible region and reflect the light of the wavelength in the near infrared region and the infrared region.

16. The sensor chip according to claim 1, wherein the first reflective member includes a plurality of portions.

17. The sensor chip according to claim 1, wherein the sensor chip further includes a pixel separation part that is configured by a groove that penetrates the semiconductor substrate from the first surface to the second surface.

18. A distance measurement apparatus, comprising:
a sensor chip that includes a pixel array section, wherein the pixel array section comprises:
a plurality of pixels that includes:
a first set of pixels, and
a second set of pixels different from the first set of pixels, wherein the second set of pixels is outside a middle part of the pixel array section;
each pixel of the plurality of pixels includes:
a semiconductor substrate that includes:
a first surface;
a second surface that is opposite to the first surface; and
an avalanche photodiode;
an on-chip lens on a side of the first surface of the semiconductor substrate;
a first reflective member that is on a front surface of the on-chip lens at a position which is opposite to the avalanche photodiode, wherein the position of the first reflective member on the on-chip lens is based on an image height of one of the first set of pixels or the second set of pixels in the pixel array section, wherein the first reflective member includes a main portion and a small portion separated from each other; and
a wiring layer on a side of the second surface of the semiconductor substrate, wherein the wiring layer includes a second reflective member.

* * * * *